US008270846B2

(12) United States Patent
Tsunoda

(10) Patent No.: US 8,270,846 B2
(45) Date of Patent: Sep. 18, 2012

(54) AMPLIFICATION CIRCUIT, DIFFERENTIAL AMPLIFICATION CIRCUIT, AND OPTICAL TRANSMITTER

(75) Inventor: Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 12/617,642

(22) Filed: Nov. 12, 2009

(65) Prior Publication Data
US 2010/0158539 A1 Jun. 24, 2010

(30) Foreign Application Priority Data

Dec. 18, 2008 (JP) ................................. 2008-321764

(51) Int. Cl.
H04B 10/04 (2006.01)
(52) U.S. Cl. ........ 398/182; 398/183; 398/186; 398/192; 398/193; 398/194; 398/158; 398/159; 398/135; 398/136; 330/253; 330/277; 330/302; 330/252; 330/260
(58) Field of Classification Search .................. 398/182, 398/183, 186, 192, 193, 194, 200, 158, 159, 398/81, 135, 136, 137, 138, 139; 330/253, 330/252, 277, 302, 306, 291, 260, 59, 308, 330/276
See application file for complete search history.

(56) References Cited

U.S. PATENT DOCUMENTS

| 6,121,840 | A | 9/2000 | Sakusabe |
| 6,813,448 | B1 * | 11/2004 | Chiappetta .................... 398/158 |
| 7,119,617 | B2 * | 10/2006 | Rokugawa et al. ........... 330/253 |
| 2005/0104661 | A1 | 5/2005 | Rokugawa |

FOREIGN PATENT DOCUMENTS

| JP | 5-062844 | 9/1993 |
| JP | 10-242776 A | 9/1998 |
| JP | 2005-073234 A | 3/2005 |
| JP | 2005-101871 | 4/2005 |

OTHER PUBLICATIONS

Yves, Baeyens et al.,"High Gain-Bandwidth Differential Distributed InP D-HBT Driver Amplifiers With Large (11.3Vpp) Output Swing at 40 Gb/s", 1697-1705, 2004.
Japanese Office Action mailed Jun. 19, 2012 for corresponding Japanese Application No. 2008-321764, with partial English-language translation.

* cited by examiner

Primary Examiner — Hanh Phan
(74) Attorney, Agent, or Firm — Fujitsu Patent Center

(57) ABSTRACT

A plurality of inductors are connected in series between a load resistor and a first transistor, and a plurality of second transistors provided in parallel are connected to the plurality of inductors.

11 Claims, 21 Drawing Sheets

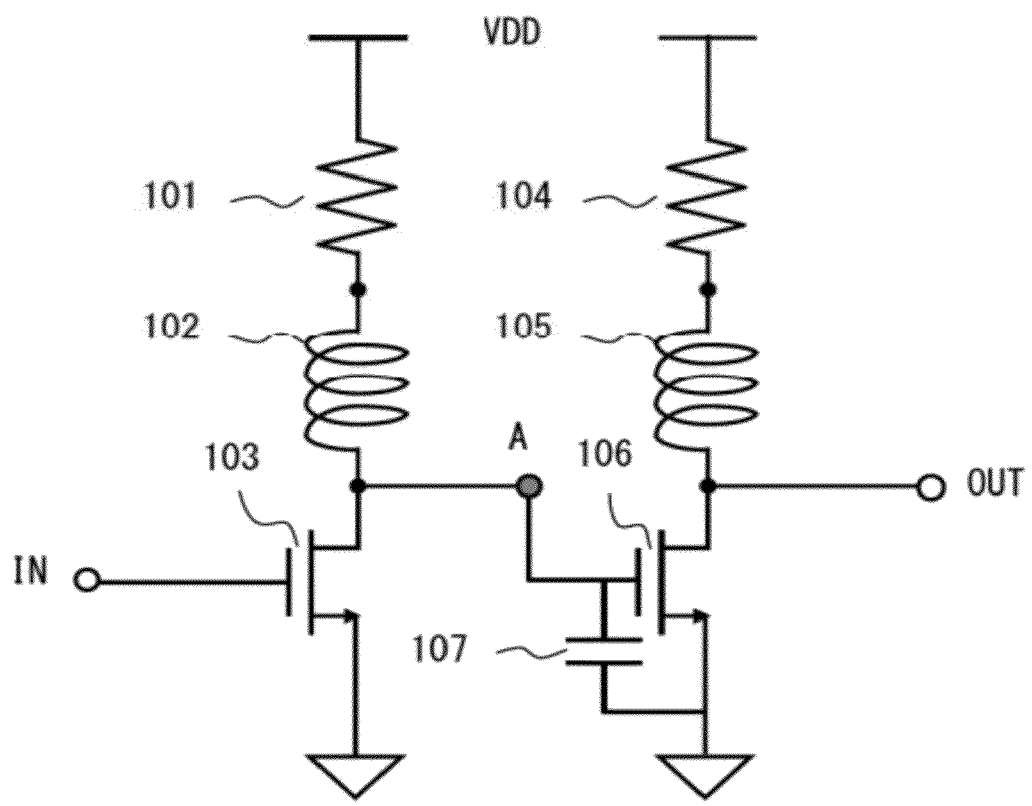
F I G. 1

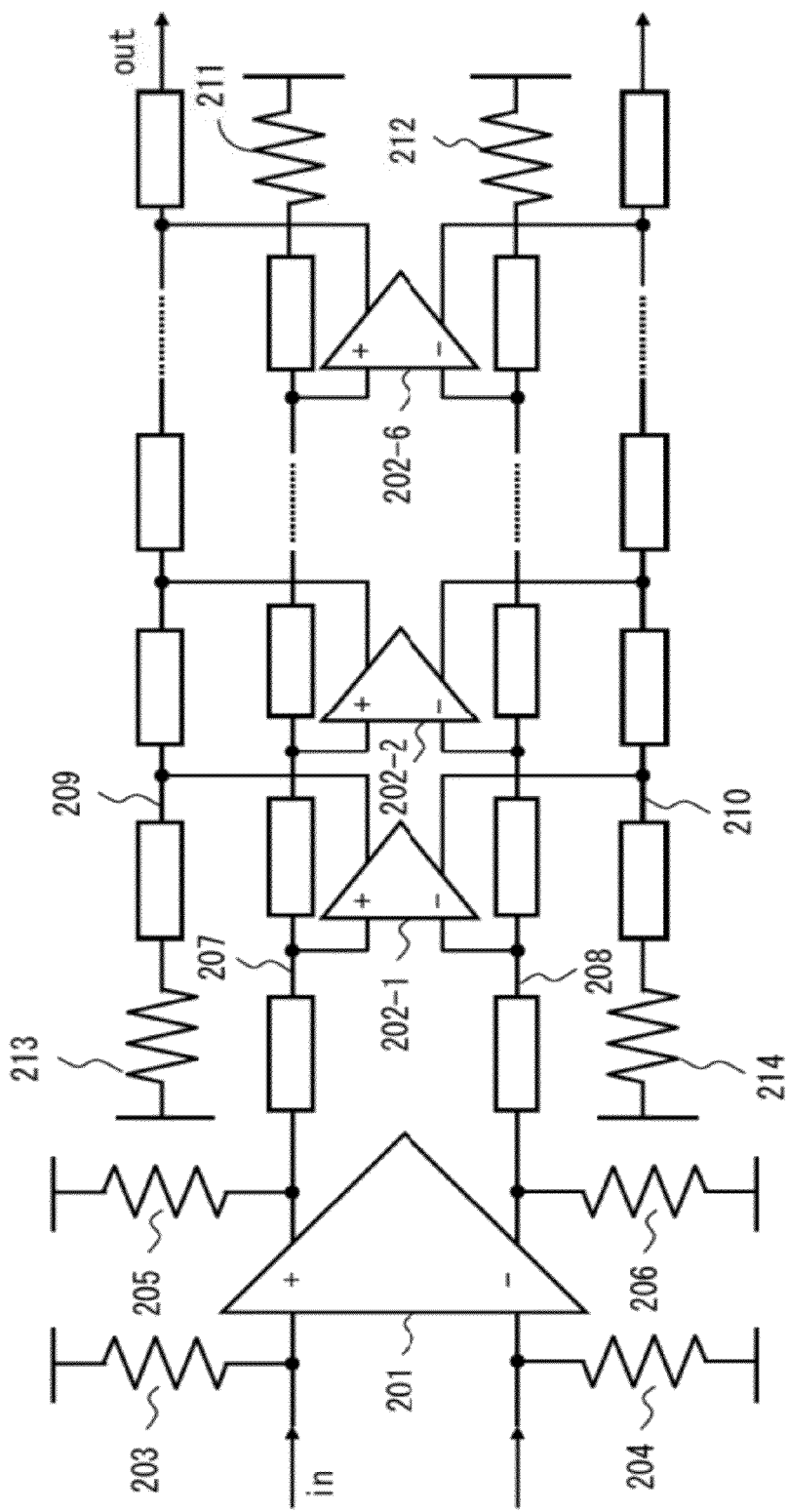
F I G. 2

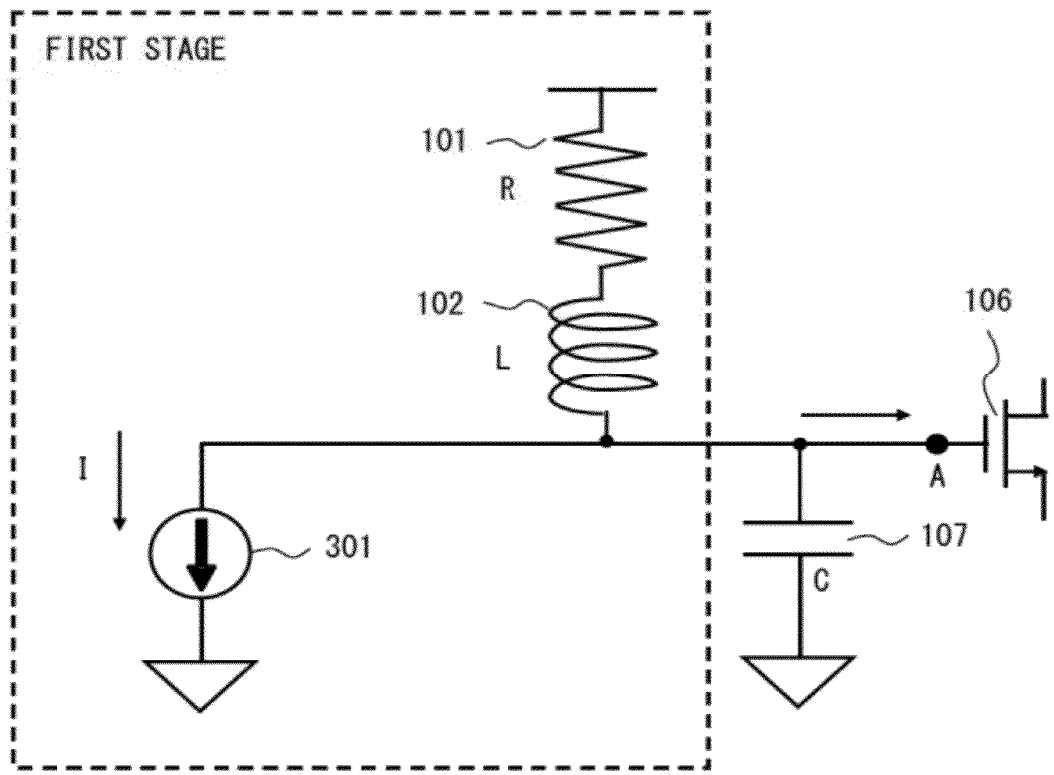
F I G. 3

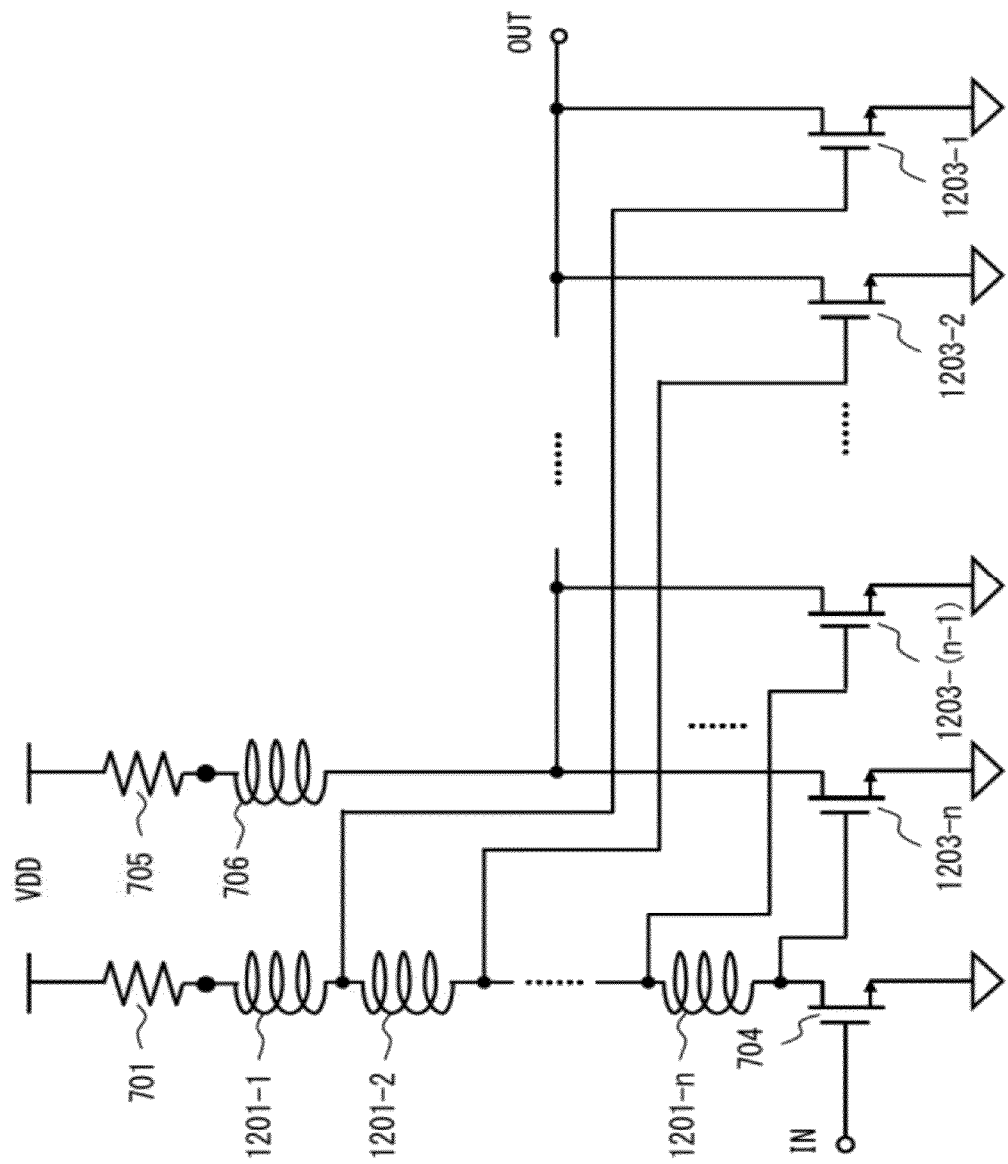
F I G. 14

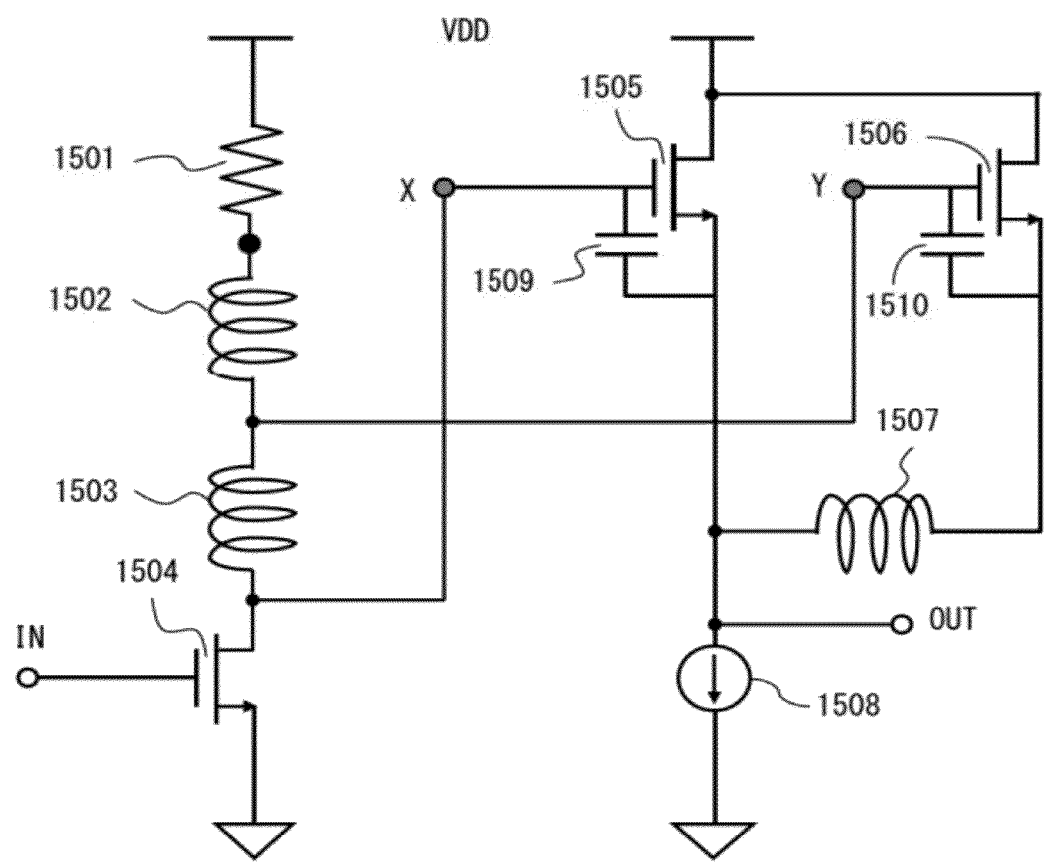
F I G. 1 5

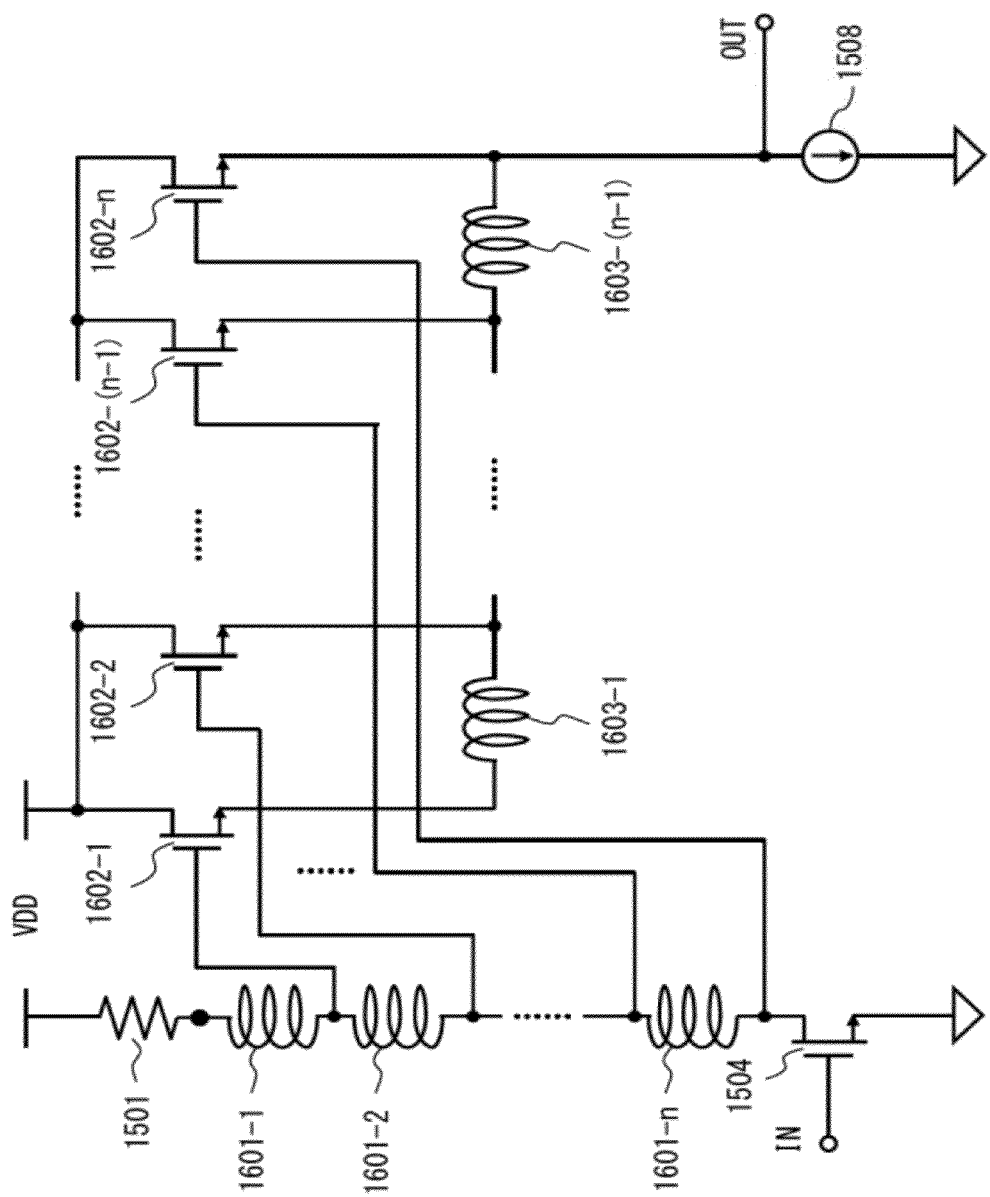
F I G. 16

US 8,270,846 B2

AMPLIFICATION CIRCUIT, DIFFERENTIAL AMPLIFICATION CIRCUIT, AND OPTICAL TRANSMITTER

CROSS-REFERENCE TO RELATED APPLICATIONS

This application is based upon and claims the benefit of priority of the prior Japanese Patent Application No. 2008-321764, filed on Dec. 18, 2008, the entire contents of which are incorporated herein by reference.

FIELD

The embodiments discussed herein are an amplification circuit for amplifying an electric signal and an optical transmitter including an amplification circuit.

BACKGROUND

With an increasing amount of communication data in a communication network as a result of a widespread use of the Internet etc., a configuration of a large capacity photonic network has been earnestly demanded. In the present photonic network, communications based on 10 Gb/s are dominant, and an optical transmitter/receiver for higher speed communications such as one based on 40 Gb/s is required for a larger capacity. To realize a higher speed optical transmitter/receiver, a higher speed drive circuit and a higher speed amplification circuit are required.

For a conventional high-speed amplification circuit, a source grounded amplification circuit has been widely used with a shunt inductor inserted in series with a load resistor. FIG. 1 is an example of a configuration of a 2-stage source grounded amplification circuit. The 2-stage source grounded amplification circuit illustrated in FIG. 1 includes resistors 101 and 104, inductors 102 and 105, and transistors 103 and 106. The resistors 101 and 104 are load resistors, and the inductors 102 and 105 are shunt inductors.

The resistor 101, the inductor 102, and the transistor 103 configure an amplifier in the first stage. One terminal of the resistor 101 is connected to a power supply potential VDD, and the inductor 102 is connected to the other terminal in series. The inductor 102 is connected to the drain of the transistor 103, and the source of the transistor 103 is connected to a grounding potential.

The resistor 104, the inductor 105, and the transistor 106 configure an amplifier in the second stage. One terminal of the resistor 104 is connected to the power supply potential VDD, and the inductor 105 is connected to the other terminal in series. The inductor 105 is connected to the drain of the transistor 106, and the source of the transistor 106 is connected to the grounding potential. By adding the amplifier in the second stage, the amplification rate can be higher than in the configuration of only the amplifier in the first stage.

The drain of the transistor 103 in the first stage is connected to the gate of the transistor 106 in the second stage at the point A. An input signal is supplied to the gate of the transistor 103, and an output signal of the amplifier in the first stage is output to the point A from the drain of the transistor 103, and the output signal of the amplifier in the second stage is output from the drain of the transistor 106.

By using the structure illustrated in FIG. 1, the degradation of the gain of a high frequency signal can be compensated for by the inductors 102 and 105. Therefore, the amplification band can be enlarged toward a high frequency area, and the characteristic of a high frequency signal can be improved.

Also well known is a differential amplification circuit having each inductor between the drain of a differential transistor and a gate grounded transistor, between a load resistor and a power supply, and between the source of a source follower transistor and an output terminal.

Furthermore known is a high-frequency amplifier for input matching for two frequencies by inserting two coils into an input matching circuit.

Another high-speed amplification circuit can be a distribution constant amplification circuit. FIG. 2 is an example of a configuration of a distribution constant amplification circuit. The distribution constant amplification circuit illustrated in FIG. 2 includes a pre-driver 201, differential amplifiers 202-1 through 202-6, resistors 203 through 206, and 211 through 214, input transmission lines 207 and 208, and output transmission lines 209 and 210.

The resistors 205 and 206 are load resistors, the resistors 211 and 212 are terminator resistors respectively included in the input transmission lines 207 and 208, and the resistors 213 and 214 are terminator resistors respectively included in the output transmission lines 209 and 210. A signal input to the pre-driver 201 is supplied to the differential amplifiers 202-1 through 202-6 through the input transmission lines 207 and 208, and an amplified signal is output through the output transmission lines 209 and 210. Using the above-mentioned distribution constant amplification circuit, a constant gain can be obtained over a broad band.

Patent Document 1: Japanese Laid-open Patent Publication No. 2005-073234

Patent Document 2: Japanese Laid-open Patent Publication No. 10-242776

Non-patent Document 1: Yves Baeyens et al., "High Gain-Bandwidth Differential Distributed InP D-HBT Driver Amplifiers with Large (11.3 Vpp) Output Swing at 40 Gb/s", IEEE Journal of Solid State Circuits, Vol. 39, No. 10, October 2004, pp. 1697-1705.

SUMMARY

According to an aspect of the embodiment, an amplification circuit includes a first transistor, a load resistor, a plurality of inductors, and a plurality of second transistors.

The plurality of inductors are connected in series between the load resistor and the first transistor. The plurality of second transistors are provided in parallel, and connected to the plurality of inductors.

According to another aspect of the embodiment, a differential amplification circuit includes first and second differential transistors, first and second load resistors, a plurality of first inductors, a plurality of second inductors, a plurality of third differential transistors, and a plurality of fourth differential transistors.

The plurality of first inductors are connected in series between the first load resistor and the first differential transistor, and the plurality of second inductors are connected in series between the second load resistor and the second differential transistor.

A plurality of third differential transistors are provided in parallel and connected to the plurality of first inductors. A plurality of fourth differential transistors are provided in parallel and connected to the plurality of second inductors.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates a configuration of a conventional 2-stage source grounded amplification circuit;

FIG. 2 illustrates a configuration of a conventional distribution constant amplification circuit;

FIG. 3 illustrates an equivalent circuit of a conventional 2-stage source grounded amplification circuit;

FIG. 14 illustrates a configuration of a fifth 2-stage source grounded amplification circuit;

FIG. 15 illustrates a configuration of a first 2-stage amplification circuit;

FIG. 16 illustrates a configuration of a second 2-stage amplification circuit;

DESCRIPTION OF EMBODIMENTS

Figure 4:
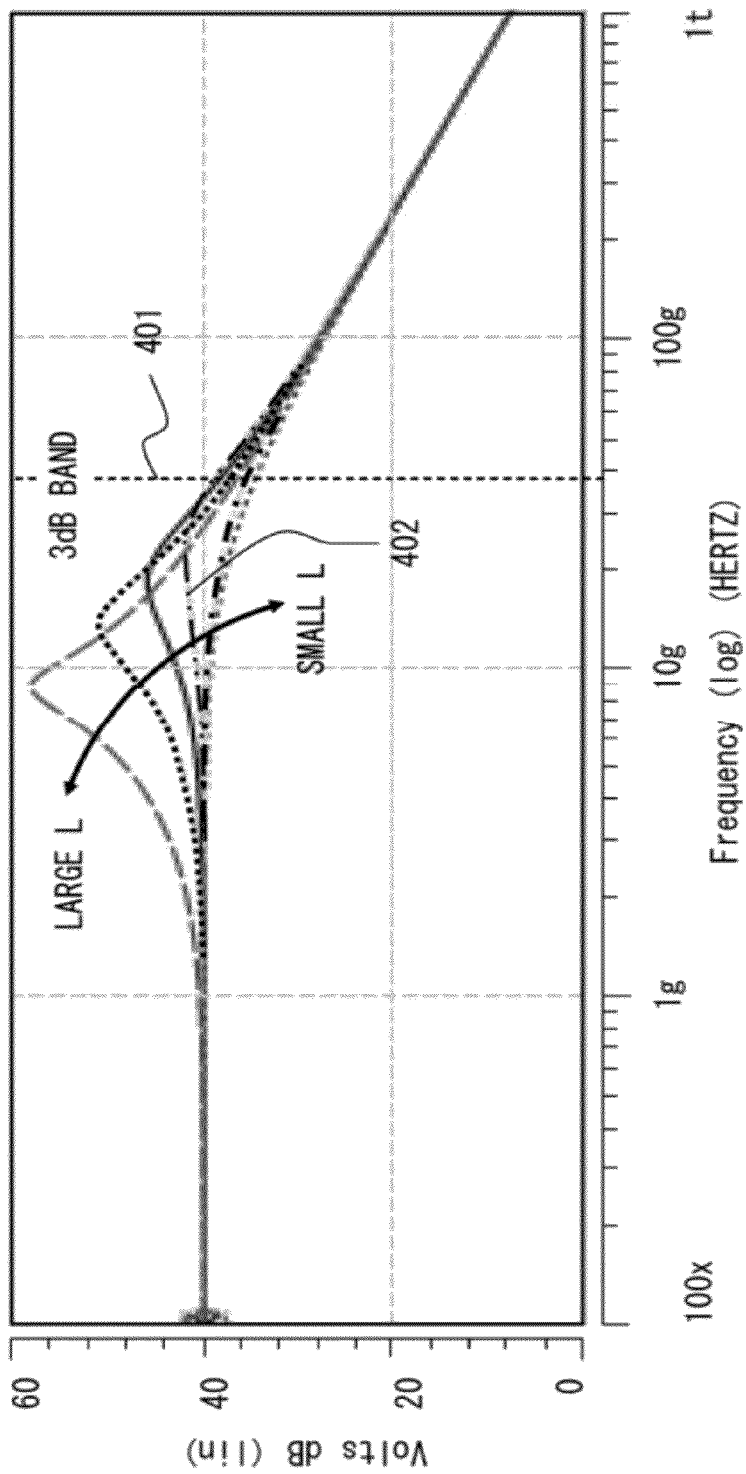
FIG. 4 illustrates the frequency characteristic of signal amplification.

The above-mentioned conventional amplification circuit has the following problem.

As illustrated in FIG. 1, when an amplifier similar to the amplifier in the first stage is connected in the second stage, an input parasitic capacity 107 connected between the gate and the source of the transistor 106 in the second stage may degrade the high frequency characteristic of a signal at the point A. The degradation can be somewhat compensated for by increasing the inductance of the inductor 102. However, there is a restriction on the range in which the inductor 102 can compensate for the degradation. When the input parasitic capacity 107 is large, the amplification characteristic of a high frequency band is degraded.

There can be a similar problem not only with the configuration illustrated in FIG. 1, but also with a common multistage amplification circuit using a transistor.

In addition, the distribution constant amplification circuit as illustrated in FIG. 2 requires impedance matching in the resistors 205, 206, 211, and 212, and the input transmission lines 207 and 208 for a long distance transmission of a high-speed signal. Therefore, there may occur the problems that the resistance values of the resistors 205 and 206 are restricted, and that the amplification can be decreased by providing the resistors 211 and 212 that seem parallel to the resistors 205 and 206.

There can be a similar problem not only with the configuration illustrated in FIG. 2, but also with a common distribution constant amplification circuit requiring the impedance matching.

Preferred embodiments of the present invention will be explained with reference to accompanying drawings.

FIG. 3 is an example of an equivalent circuit of the 2-stage source grounded amplification circuit illustrated in FIG. 1. In the equivalent circuit illustrated in FIG. 3, the transistor 103 in the first stage is replaced with a current source 301 for supplying electric current I. In this case, the amplifier in the first stage drives the amplifier in the second stage having the input parasitic capacity 107. The load impedance Z at the point A corresponding to the gate of the transistor 106 in the second stage is expressed by the following equations.

$$Z = \frac{R + j\omega L}{1 = \omega^2 CL + j\omega CR} \quad (1)$$

$$|Z| = \sqrt{\frac{R^2 + \omega^2 L^2}{(1 - \omega^2 CL)^2 + \omega^2 C^2 R^2}} \quad (2)$$

$$= \sqrt{\frac{R^2 + \omega^2 L^2}{1 - 2\omega^2 CL + \omega^4 C^2 L^2 + \omega^2 C^2 R^2}}$$

R indicates the resistance value of the resistor 101, L indicates the inductance of the inductor 102, C indicates the value of the input parasitic capacity 107, and ω indicates the angular frequency of an input signal.

In a high frequency band having a large value of ω, $\omega^2 L^2$ as the numerator in the equation (2) cannot be ignored. Therefore, the absolute value of the load impedance Z can be large by assigning a large value of L. However, when L is a predetermined value or more, the influence of $\omega^4 C^2 L^2$ as the denominator is higher than that of $\omega^2 L^2$ as the numerator in the equation (2), and the absolute value of the load impedance Z becomes smaller as the frequency gets higher. Therefore, although the value of L is large, there is a restriction in the width of spreading the band toward a high frequency area in which the signal amplification at the point A can be a predetermined value or more.

FIG. 4 illustrates the frequency characteristics of signal amplification at the point A which can be calculated by the equation (2) with respect to different values of L. In this example, six values of L=0, 100, 500, 1000, 2000, and 5000 (pH) are used. For example, a curve 402 indicates signal amplification when L=500 (pH).

A curve 401 indicates the maximum frequency of 3 dB band of the signal amplification expressed by the curve 402. 3 dB band refers to the band between two frequencies in which the signal amplification is about half of the maximum value. In FIG. 4, the width of 3 dB band does not spread toward the high frequency area although the value of L is a predetermined value or more.

As known from the equation (2), the width of 3 dB band depends on the value C of the input parasitic capacity 107 at the second stage. The smaller the value of C, the lower the influence of $\omega^4 C^2 L^2$ as the denominator. Therefore, the signal amplification at the point A becomes larger, and the width of 3 dB band is spread toward the high frequency area.

The value C of the input parasitic capacity 107 becomes smaller as the size of the transistor 106 is made smaller. Then, it is assumed that the transistor 106 in the second stage is divided into a plurality of smaller transistors and the transistors are connected to one another, thereby reducing the input parasitic capacity in the second stage.

Figure 5:
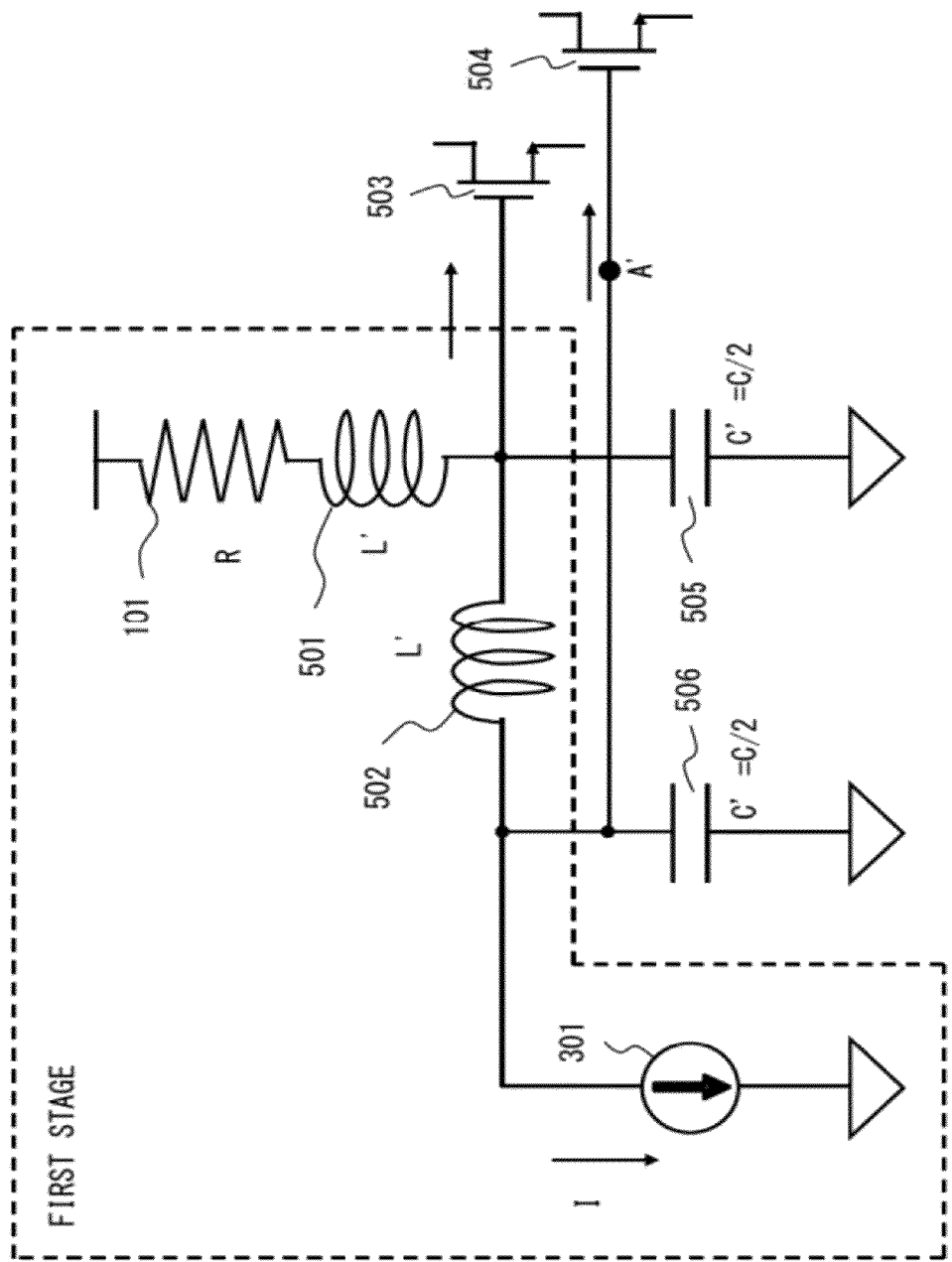
FIG. 5 illustrates an equivalent circuit of a first 2-stage source grounded amplification circuit.

FIG. 5 is an example of a configuration in which the transistor 106 illustrated in FIG. 3 is divided into two transistors. The equivalent circuit illustrated in FIG. 5 has a configuration in which the inductor 102 of the equivalent circuit illustrated in FIG. 3 is replaced with an inductor 501, and the transistor 106 is replaced with transistors 503 and 504.

The gate of the transistor 503 is connected to the inductor 501, and the gate of the transistor 504 is connected to the current source 301, and an inductor 502 is connected between the current source 301 and the inductor 501. Therefore, the gates of the transistors 503 and 504 are connected to each other through the inductor 502.

Assuming that the size (gate width) of the transistors 503 and 504 is ½ of the size of the transistor 106, the value C' of the input parasitic capacities 505 and 506 of the transistors 503 and 504 is C/2.

In this case, the amplifier in the first stage drives the amplifier in the second stage having the input parasitic capacities 505 and 506, and since the value C' is smaller than the value C of the input parasitic capacity 107 illustrated in FIG. 3, it is expected that the load impedance of the amplifier in the second stage becomes smaller. If the inductances of the inductors 501 and 502 are L', the load impedance Z' at the point A' corresponding to the gate of the transistor 504 is expressed by the following equations.

$$Z' = \frac{(R - \omega^2 C' L' R) + j(2\omega L' - \omega^3 C' L'^2)}{(1 - 3\omega^2 C' L' + \omega^4 C'^2 L'^2) + j(2\omega C' R - \omega^3 C'^2 L' R)} \quad (3)$$

$$|Z'| = \sqrt{\frac{(R - \omega^2 C' L' R)^2 + (2\omega L' - \omega^3 C' L'^2)^2}{(1 - 3\omega^2 C' L' + \omega^4 C'^2 L'^2) + (2\omega C' R - \omega^3 C'^2 L' R)}} \quad (4)$$

Figure 6:
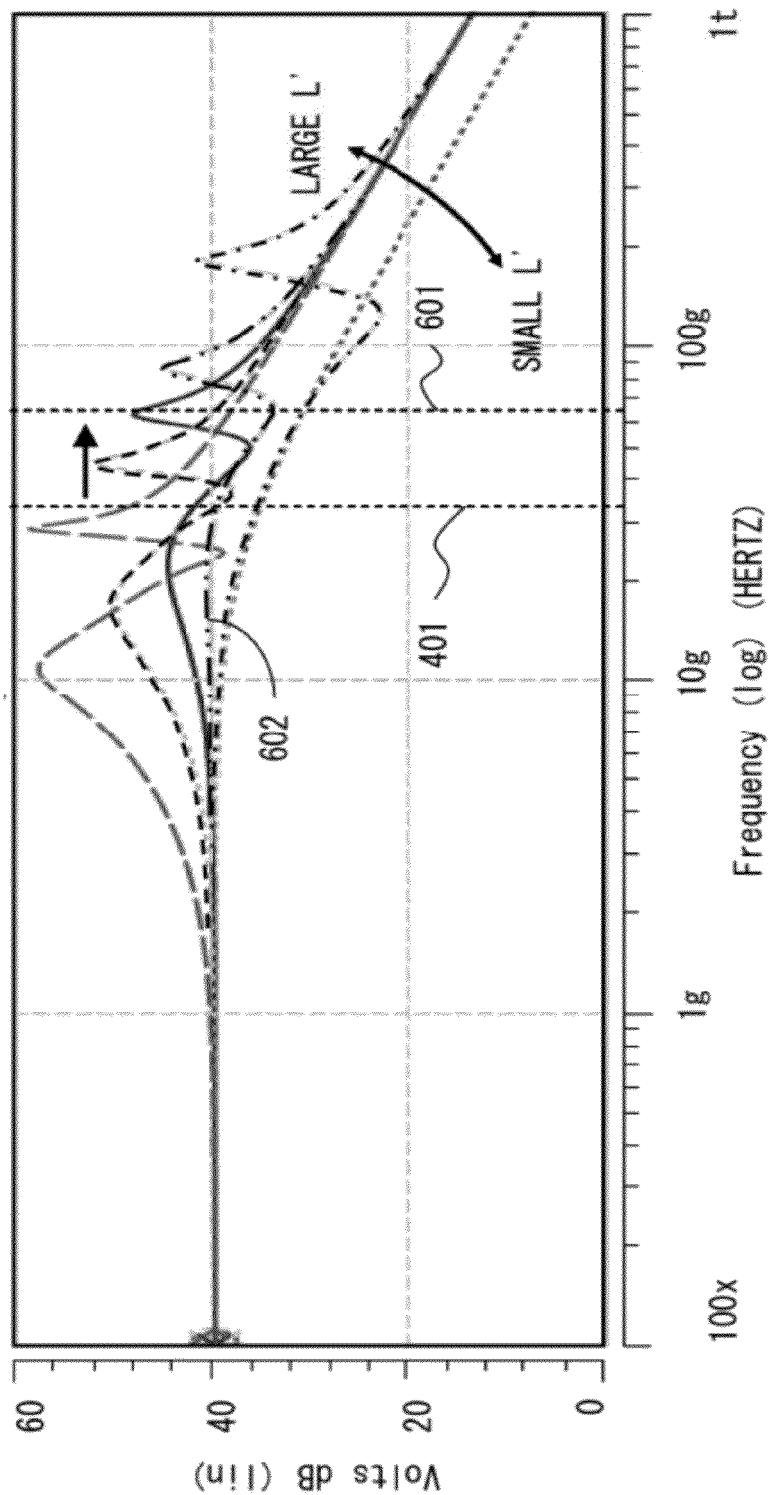
FIG. 6 illustrates a frequency characteristic of signal amplification in a first 2-stage source grounded amplification circuit.

FIG. 6 illustrates the frequency characteristics of the signal amplification at the point A' that is calculated by the equation (4) on the different values of L'. In this example, six values of L'=0, 100, 500, 1000, 2000, and 5000 (pH) are used. For example, a curve 602 indicates signal amplification when L=500 (pH).

A straight line 601 indicates the maximum frequency of 3 dB band of the signal amplification expressed by the curve 602. In this case, the 3 dB band expressed by the straight line 601 spreads broader toward the high frequency area than the 3 dB band expressed by the straight line 401 in FIG. 4. By the equation (4), the 3 dB band can be spread larger than in the case illustrated in FIG. 4 by appropriately setting the value of L' without limiting it to L'=500 (pH).

It is not necessary that the sizes of the transistors 503 and 504 are the same, and the sizes may be different from each other. For example, the size of the transistor 503 may be ⅔ of the size of the transistor 106, and the size of the transistor 504 may be ⅓ of the size of the transistor 106. Furthermore, the inductances of the inductors 501 and 502 may also be different from each other.

Figure 7:
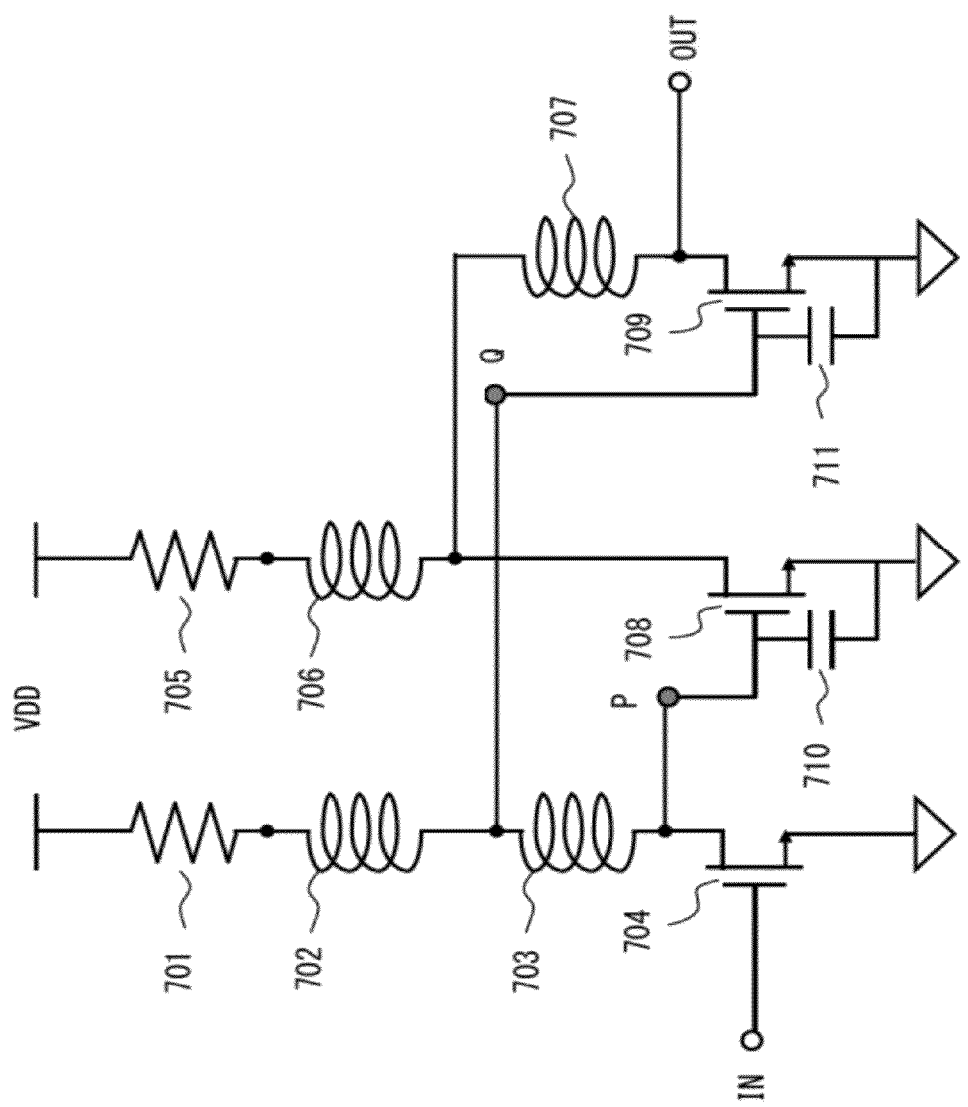
FIG. 7 illustrates a configuration of a second 2-stage source grounded amplification circuit.

FIG. 7 is an example of a configuration of the 2-stage source grounded amplification circuit according to an embodiment. The 2-stage source grounded amplification circuit illustrated in FIG. 7 includes resistors 701 and 705, inductors 702, 703, 706, and 707, and transistors 704, 708, and 709. The resistors 701 and 705 are load resistors, the inductors 702, 703, and 706 are shunt inductors for spreading the band.

The resistor 701, the inductors 702 and 703, and the transistor 704 configure the amplifier in the first stage. One terminal of the resistor 701 is connected to the power supply potential VDD and the inductors 702 and 703 are connected in series to the other terminal. The inductor 703 is connected to the drain of the transistor 704, and the source of the transistor 704 is connected to the grounding potential.

The resistor 705, the inductors 706 and 707, and the transistors 708 and 709 configure the amplifier in the second stage. One terminal of the resistor 705 is connected to the power supply potential VDD, and the inductor 706 is connected in series to the other terminal. The inductor 706 is connected to the drain of the transistor 708, and the drain of the transistor 708 and the drain of the transistor 709 are connected by the inductor 707. The sources of the transistors 708 and 709 are connected to the grounding potential.

The drain of the transistor 704 in the first stage is connected to the gate of the transistor 708 in the second stage at the point P, and the gate of the transistor 709 in the second stage is connected between the inductors 702 and 703 at the point Q. Therefore, the gates of the transistors 708 and 709 connected in parallel are connected to each other through the inductor 703, and their drains are connected to each other through the inductor 707. The inductor 707 is provided for adjusting the signal timing in the amplifier in the second stage.

An input signal is provided for the gate of the transistor 704, and an output signal of the amplifier in the first stage is output to the points P and Q, and an output signal of the amplifier in the second stage is output from the drain of the transistor 709. At this time, the transistors 708 and 709 in the second stage have the input parasitic capacities 710 and 711 between the respective gates and sources.

The ratio of the sizes of the transistors 708 and 709 is not specifically restricted, and the inductances of the inductors 702 and 703 may be determined depending on the sizes of the transistors 708 and 709.

The method of connecting the inductors 702 and 703 and the gates of the transistors 708 and 709 is not limited to the connecting method illustrated in FIG. 7, but the connection destinations of the gates of the transistors 708 and 709 may be exchanged.

In the configuration illustrated in FIG. 7, as in the case of the equivalent circuit in FIG. 5, the signal band can be spread toward the high frequency area, and the waveform of the high-speed signal can be improved.

Figure 8:
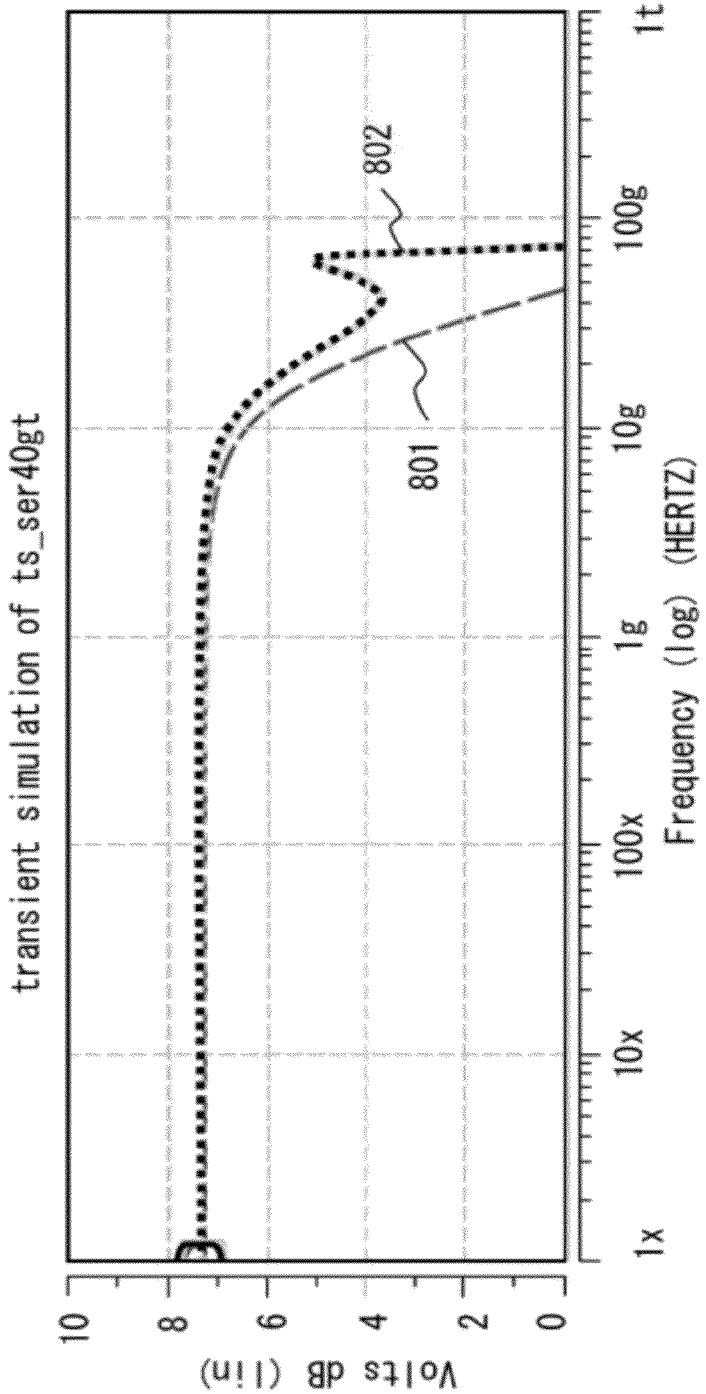
FIG. 8 illustrates frequency characteristics of an output signal of conventional 2-stage source grounded amplification circuit and second 2-stage source grounded amplification circuit.

FIG. 8 illustrates the comparison between the frequency characteristics of the 2-stage source grounded amplification circuits in FIGS. 1 and 7. Curves 801 and 802 indicate the frequency characteristics of the output signals of the 2-stage source grounded amplification circuits in FIGS. 1 and 7 respectively.

In this example, it is assumed that the sizes of the transistors 708 and 709 are ½ of the size of the transistor 106 in FIG. 1, the values of the input parasitic capacities 710 and 711 are C/2, and the inductances of the inductors 702 and 703 are the same. The signal band of the 2-stage source grounded amplification circuit in FIG. 7 is spread broader into the high frequency area than the signal band of the 2-stage source grounded amplification circuit in FIG. 1.

Figure 9:
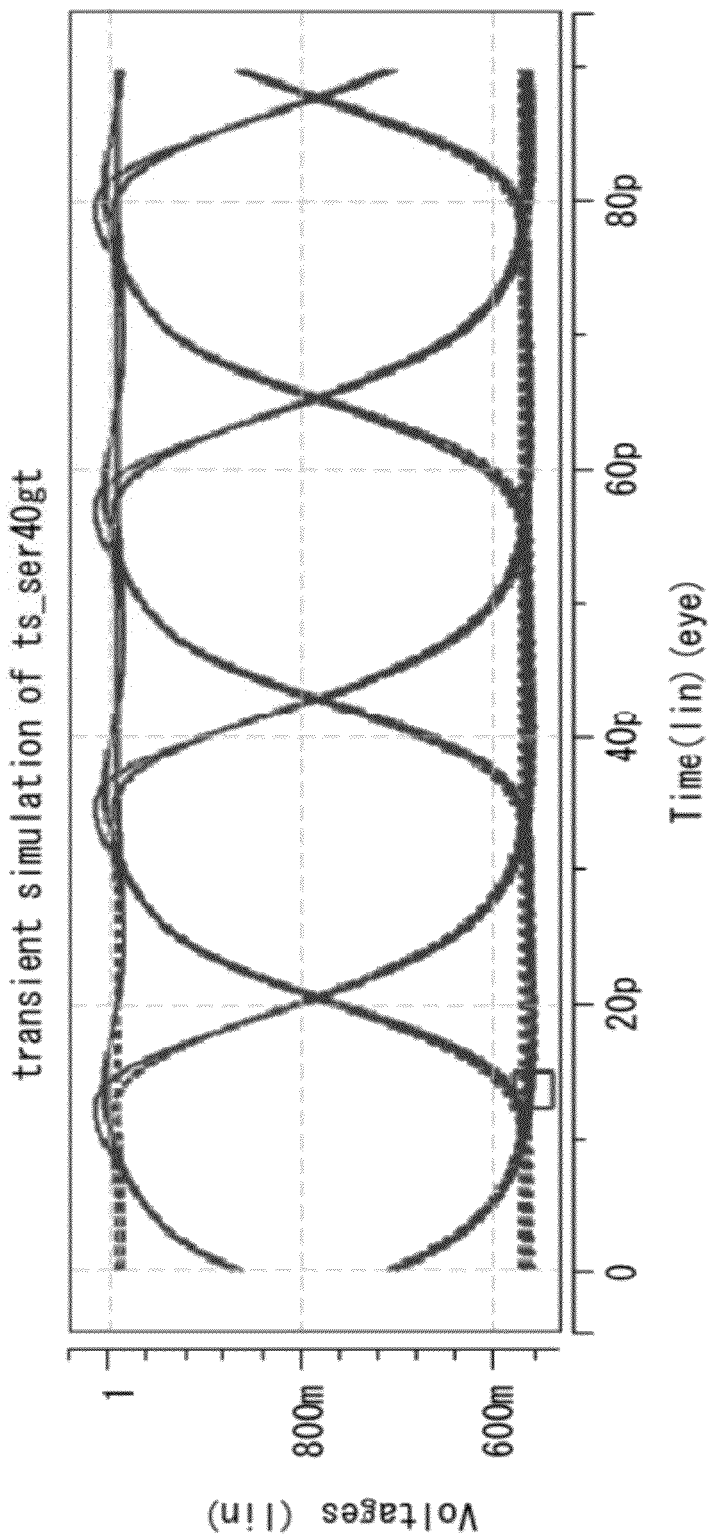
FIG. 9 illustrates a waveform of an output signal of a conventional 2-stage source grounded amplification circuit.
Figure 10:
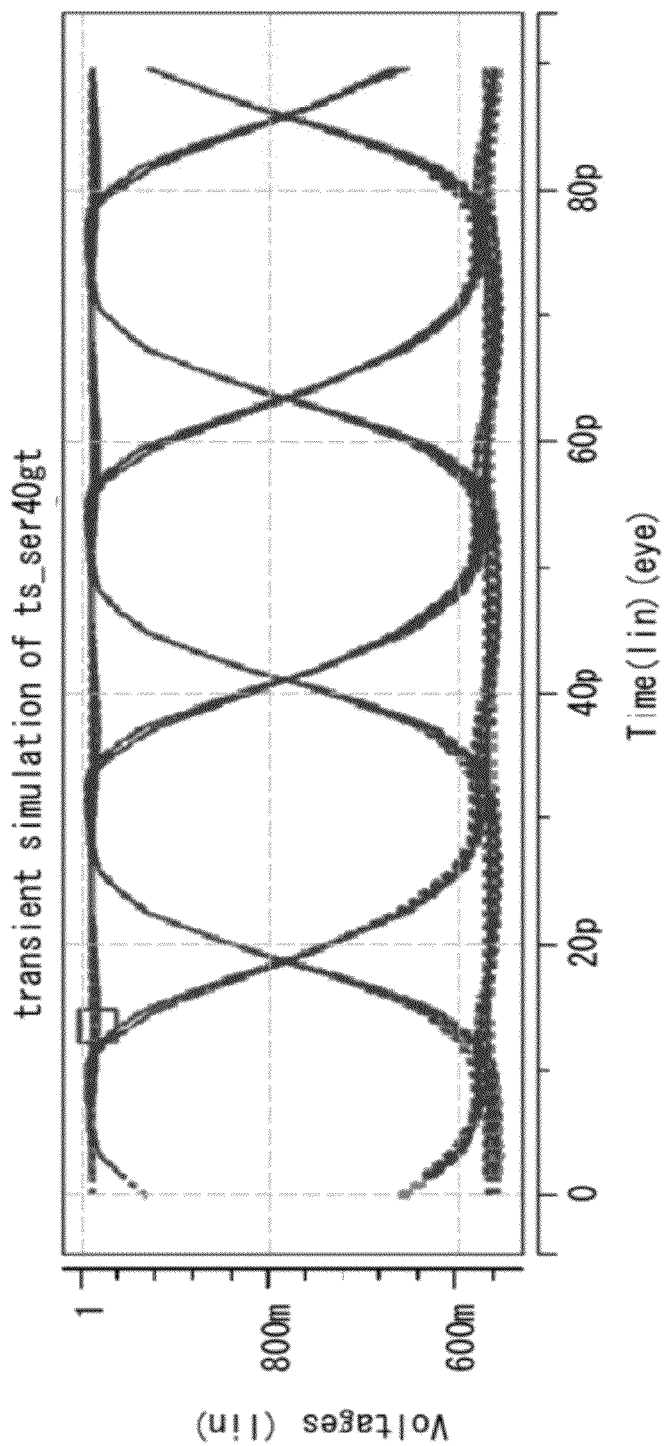
FIG. 10 illustrates a waveform of an output signal of a second 2-stage source grounded amplification circuit.

FIGS. 9 and 10 illustrate the waveforms of the output signals of the 2-stage source grounded amplification circuits in FIGS. 1 and 7 respectively. It is clear that the output signal of the 2-stage source grounded amplification circuit in FIG. 7 is improved in waveform more than the output signal of the 2-stage source grounded amplification circuit in FIG. 1.

Figure 11:
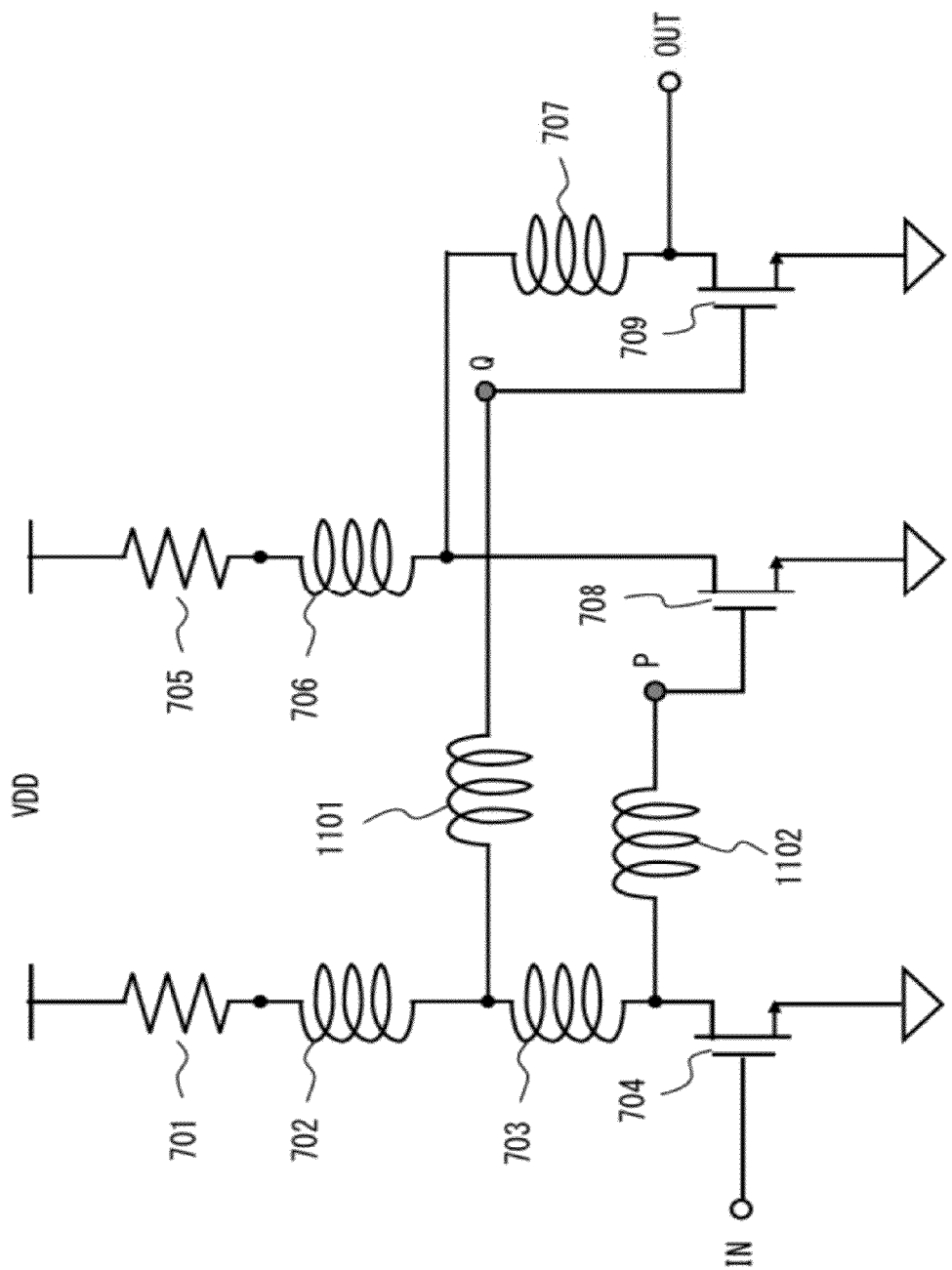
FIG. 11 illustrates a configuration of a third 2-stage source grounded amplification circuit.

FIG. 11 is an example of a configuration of the 2-stage source grounded amplification circuit in which the amplifier in the first stage and the amplifier in the second stage are connected to each other by the inductor. The 2-stage source grounded amplification circuit in FIG. 11 has a configuration in which inductors 1101 and 1102 are added to the 2-stage source grounded amplification circuit in FIG. 7.

One terminal of the inductor 1101 is connected between the inductors 702 and 703 in the first stage, and the other terminal is connected to the gate of the transistor 709 in the second stage. Additionally, one terminal of the inductor 1102 is connected to the drain of the transistor 704 in the first stage, and the other terminal is connected to the gate of the transistor 708 in the second stage.

Thus, by connecting the amplifier in the first stage and the amplifier in the second stage by an inductor, the degradation of the high frequency characteristic of the amplifier in the first stage caused on the input parasitic capacities of the transistors 708 and 709 can be reduced, thereby further improving the waveform of the high frequency signal.

Figure 12:
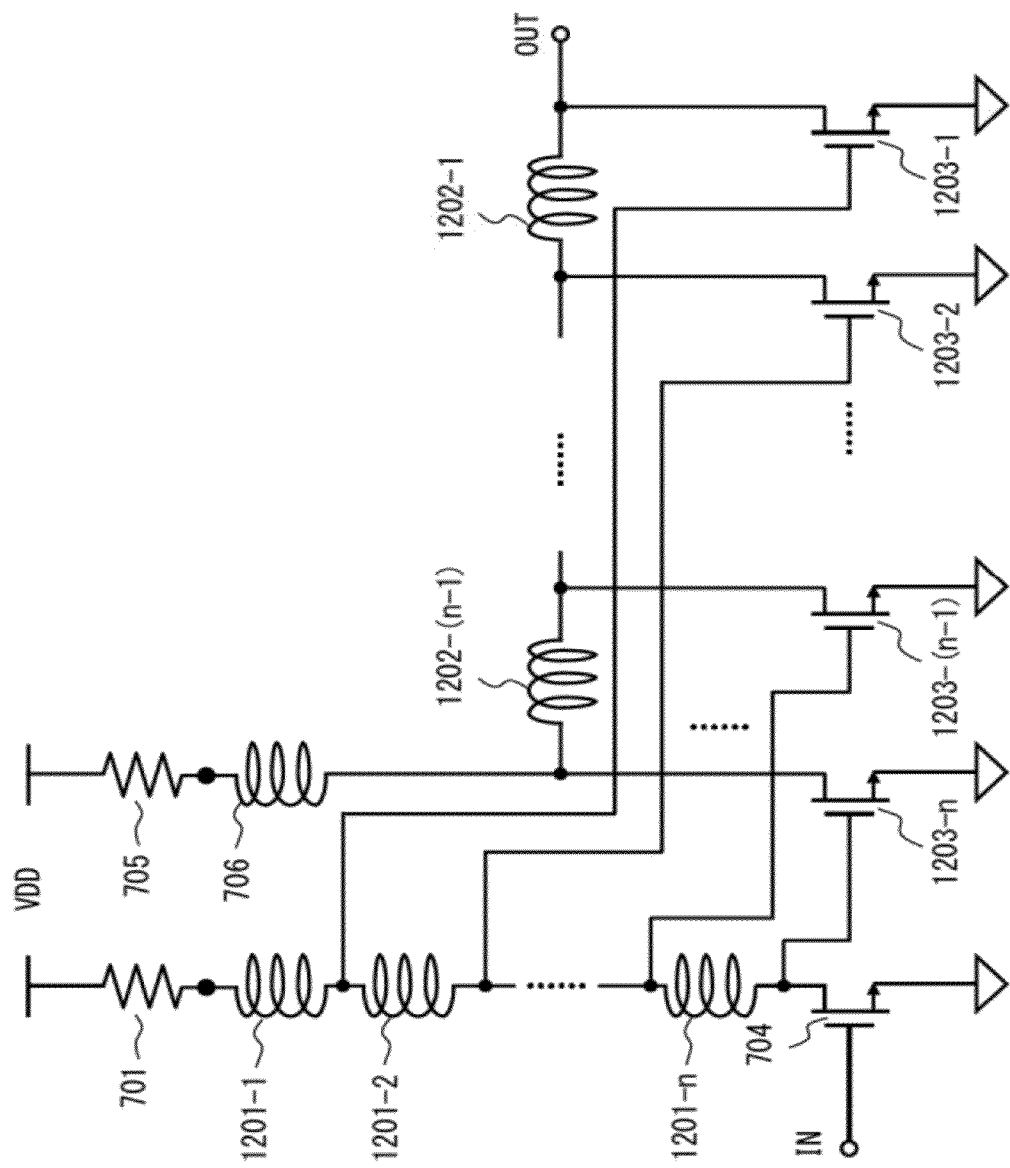
FIG. 12 illustrates a configuration of a fourth 2-stage source grounded amplification circuit.

FIG. 12 is an example of a configuration of a 2-stage source grounded amplification circuit obtained by dividing a transistor in the second stage into n (n indicates an integer of 2 or more) transistors. The 2-stage source grounded amplification circuit in FIG. 12 is obtained by replacing the transistors 708 and 709 with transistors 1203-1 through 1203-n in the 2-stage source grounded amplification circuit in FIG. 7. Furthermore, the inductors 702 and 703 are replaced with inductors 1201-1 through 1201-n, and the inductor 707 is replaced with inductors 1202-1 through 1202-(n–1).

The resistor 701, the inductors 1201-1 through 1201-n, and the transistor 704 configure the amplifier in the first stage. One terminal of the resistor 701 is connected to the power supply potential VDD, and the inductors 1201-1 through 1201-n are connected in series to the other terminal. The inductor 1201-n is connected to the drain of the transistor 704, and the source of the transistor 704 is connected to the grounding potential.

The resistor 705, the inductor 706, 1202-1 through 1202-(n–1), and the transistors 1203-1 through 1203-n configure the amplifier in the second stage. One terminal of the resistor 705 is connected to the power supply potential VDD, and the inductor 706 is connected in series to the other terminal. The inductor 706 is connected to the drain of the 1203-n, and the drain of the transistor 1203-i (i=n, n–1, ..., 2) and the drain of the transistor 1203-(i–1) are connected by the inductor 1202-(i–1). The sources of the transistors 1203-1 through 1203-n are connected to the grounding potential.

The drain of the transistor 704 is connected to the gate of the 1203-n in the second stage, and the gate of the transistor 1203-(i–1) in the second stage is connected between the inductor 1201-(i–1) and the inductor 1201-(i–1). Therefore, the gates of the transistors 1203-i and the 1203-(i–1) are connected to each other through the inductor 1201-i, and their drains are connected to each other through the 1202-(i–1). The inductors 1202-1 through 1202-(n–1) are provided for adjusting the signal timing in the amplifier in the second stage.

An input signal is supplied to the gate of the transistor 704, and an output signal of the amplifier in the first stage is output to the gate of the transistors 1203-1 through 1203-n, and an output signal of the amplifier in the second stage is output from the drain of the inductor 1203-1.

The ratio of the sizes of the transistors 1203-1 through 1203-n is not specifically restricted, and the inductances of the inductors 1201-1 through 1201-n may determined depending on the sizes of the transistors 1203-1 through 1203-n.

In addition, the method of connecting the gates of the inductors 1201-1 through 1201-n and the transistors 1203-1 through 1203-n is not limited to the connecting method in FIG. 12, but the connection destinations of the gates of the transistors 1203-1 through 1203-n may be exchanged.

In the configuration in FIG. 12, as in the case of the 2-stage source grounded amplification circuit in FIG. 7, the signal band can be spread toward the high frequency area, and the waveform of a high-speed signal can be improved.

Furthermore, since the 2-stage source grounded amplification circuits in FIGS. 7 and 12 are not configured by a distribution constant circuit but by a lumped constant circuit, they can be realized without impedance matching or termination by a terminator resistor.

Figure 13:
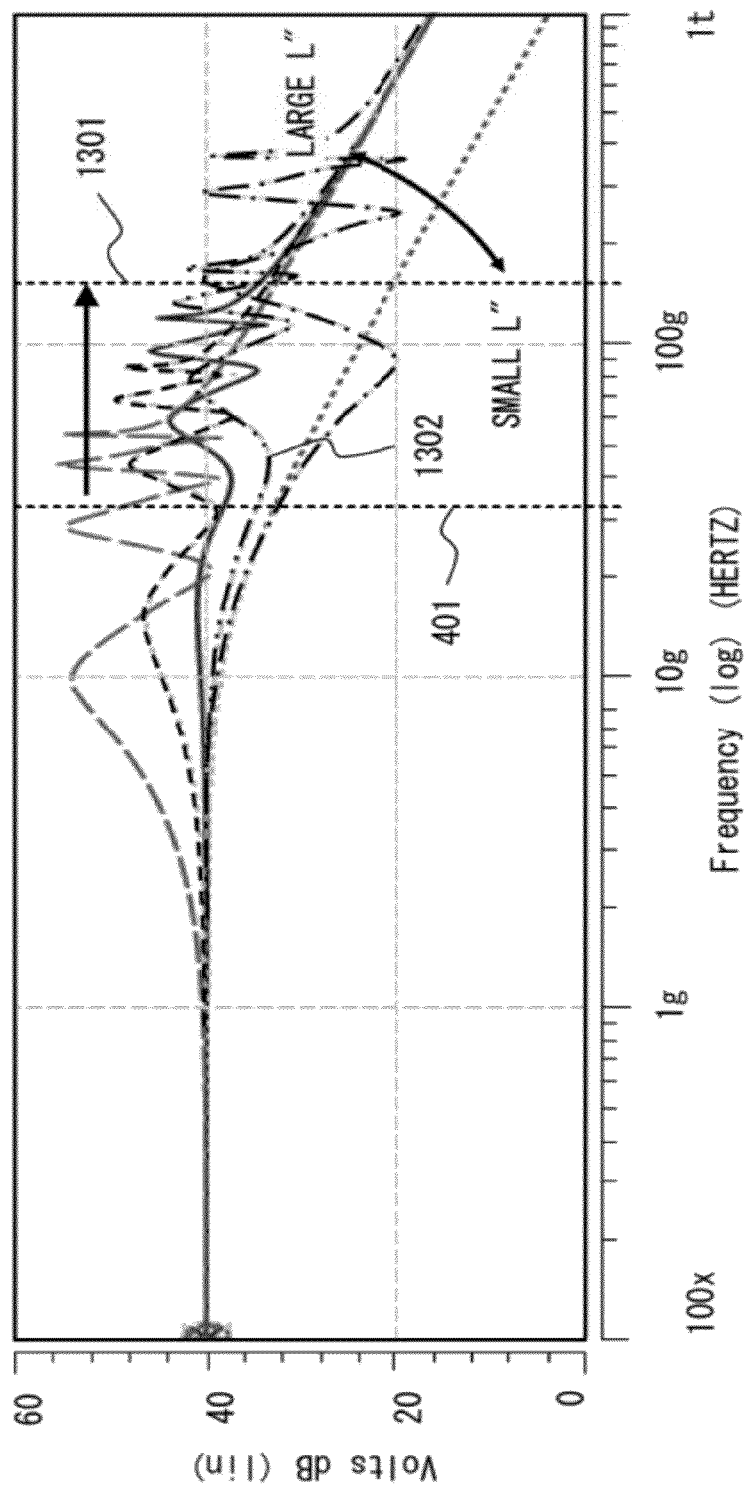
FIG. 13 illustrates a frequency characteristic of signal amplification in a fourth 2-stage source grounded amplification circuit.

FIG. 13 illustrates the frequency characteristics of signal amplification in the gate of the inductor 1203-1 when n=4 in FIG. 12. In this example, all inductances of the inductors 1201-1 through 1201-n are L", and six values of L"=0, 100, 500, 1000, 2000, 5000 (pH) are used. For example, a curve 1302 indicates signal amplification when L"=500 (pH).

A straight line 1301 indicates the maximum frequency of 3 dB band of the signal amplification expressed by a curve 1302. In this case, the 3 dB band expressed by the straight line 1301 spreads toward the high frequency area more than the 3 dB band expressed by the straight line 601 in FIG. 6. By appropriately setting the value of L" without limiting the value L" to 500 (pH), the 3 dB band can be spread more than in the case in FIG. 6. The larger the number n of divisions of the transistor in the second stage is, the more broadly the signal band can be spread.

In the 2-stage source grounded amplification circuit in FIG. 12, the inductors 1202-1 through 1202-(n–1) may be replaced with the wiring inductances. FIG. 14 illustrates the configuration of the 2-stage source grounded amplification circuit in this case.

Also in the 2-stage source grounded amplification circuits in FIGS. 12 and 14, the high frequency characteristic can be further improved by connecting the amplifier in the first stage and the amplifier in the second stage by the inductor as illustrated in FIG. 11.

The above-mentioned embodiments describe examples of source grounded amplification circuits, but the high frequency characteristic can be improved by dividing a source follower transistor into a plurality of transistors where the source follower transistor is used in the amplifier in the second stage.

FIG. 15 is an example of a configuration of a 2-stage amplification circuit where a source follower transistor is used in the amplifier in the second stage. The 2-stage amplification circuit in FIG. 15 includes a resistor 1501, inductors 1502, 1503, and 1507, transistors 1504, 1505, and 1506, inductors 1502, 1503, and 1507, transistors 1504, 1505, and 1506, and an current source 1508. The resistor 1501 is a load resistor, and the inductors 1502 and 1503 are shunt inductors for spreading a band.

The resistor 1501, the inductors 1502 and 1503, and the transistor 1504 configure an amplifier in the first stage. One terminal of the resistor 1501 is connected to the power supply potential VDD, and the inductors 1502 and 1503 are connected in series to the other terminal. The inductor 1503 is connected to the drain of the transistor 1504, and the source of the transistor 1504 is connected to the grounding potential.

The transistors 1505 and 1506, the inductor 1507, and the current source 1508 configure an amplifier in the second stage. The drains of the transistors 1505 and 1506 are connected to the power supply potential VDD, and the current source 1508 is connected between the source of the transistor 1505 and the grounding potential. The current source 1508 can be replaced with a resistor. The source of the transistor 1505 and the source of the transistor 1506 are connected by the inductor 1507.

The drain of the transistor 704 in the first stage is connected to the gate of the transistor 1505 in the second stage at the point X, and the gate of the transistor 1506 in the second stage is connected between the inductor 1502 and the inductor 1503 at the point Y. Therefore, the gates of the transistors 1505 and 1506 are connected to each other through the inductor 1503, and their sources are connected to each other through the inductor 1507. The inductor 1507 is provided for adjusting the signal timing in the amplifier in the second stage.

An input signal is supplied to the gate of the transistor 1504, an output signal of the amplifier in the first stage is output to the points X and Y, and an output signal of the amplifier in the second stage is output from the source of the transistor 1505. In this case, the transistors 1505 and 1506 in the second stage have input parasitic capacities 1509 and 1510 between the respective gates and sources.

The ratio of the sizes of the transistors 1505 and 1506 is not specifically limited, and the inductances of the inductors 1502 and 1503 may be determined depending on the sizes of the transistors 1505 and 1506.

In addition, the method of connecting the inductors 1502 and 1503 and the transistors 1505 and 1506 is not limited to the connecting method in FIG. 15, but the connection destination of the gates of the transistors 1505 and 1506 may be exchanged.

With the configuration in FIG. 15, the degradation of the high frequency characteristic of the amplifier in the first stage caused by the input parasitic capacities 1509 and 1510 can be reduced, thereby improving the waveform of a high-speed signal.

FIG. 16 is an example of a configuration of the 2-stage amplification circuit obtained by dividing a source follower transistor in the second stage into n (n indicates an integer of 2 or more) transistors. The 2-stage amplification circuit in FIG. 16 has a configuration in which the transistors 1505 and 1506 are replaced with transistors 1602-1 through 1602-n in the 2-stage amplification circuit in FIG. 15. Furthermore, the inductors 1502 and 1503 are replaced with inductors 1601-1 through 1601-n, and the inductor 1507 is replaced with inductors 1603-1 through 1603-(n−1).

The resistor 1501, the inductors 1601-1 through 1601-n, and the transistor 1504 configure an amplifier in the first stage. One terminal of the resistor 1501 is connected to the power supply potential VDD, and the inductors 1601-1 through 1601-n are connected in series to the other terminal. The inductor 1601-n is connected to the drain of the transistor 1504, and the source of the transistor 1504 is connected to the grounding potential.

The transistors 1602-1 through 1602-n, the inductors 1603-1 through 1603-(n−1), and the current source 1508 configure an amplifier in the second stage. The drains of the transistors 1602-1 through 1602-n are connected to the power supply potential VDD, and the current source 1508 is connected between the source of a transistor 1602-n and grounding potential. The source of the transistor 1602-i (i=1, 2, ..., n−1) and the source of a 1602-(i+1) are connected by an inductor 1603-i.

The drain of the transistor 1504 in the first stage is connected to the gate of the transistor 1602-n in the second stage, and the gate of the transistor 1602-i in the second stage is connected between an inductor 1601-i and an inductor 1601-(i+1). Therefore, the gates of the transistors 1602-i and 1602-(i+1) connected in parallel are connected to each other through the inductor 1601-(i+1), and their sources are connected through the inductor 1603-i. The inductors 1603-1 through 1603-(n−1) are provided for adjusting the signal timing in the amplifier in the second stage.

An input signal is supplied to the gate of the transistor 1504, and an output signal of the amplifier in the first stage is output to the gate of the transistors 1602-1 through 1602-n, and an output signal of the amplifier in the second stage is output from the source of the transistor 1602-n.

The ratio of the sizes of the transistors 1602-1 through 1602-n is not specifically limited, and the inductances of the inductors 1601-1 through 1601-n may be determined depending on the sizes of the transistors 1602-1 through 1602-n.

In addition, the method of connecting the inductors 1601-1 through 1601-n and the transistors 1602-1 through 1602-n is not limited to the connecting method in FIG. 16, but the connection destinations of the gates of the transistors 1602-1 through 1602-n may be exchanged.

With the configuration in FIG. 16, as in the case of the 2-stage amplification circuit in FIG. 15, the signal band can be spread toward the high frequency area, thereby improving the waveform of a high-speed signal.

Figure 17:
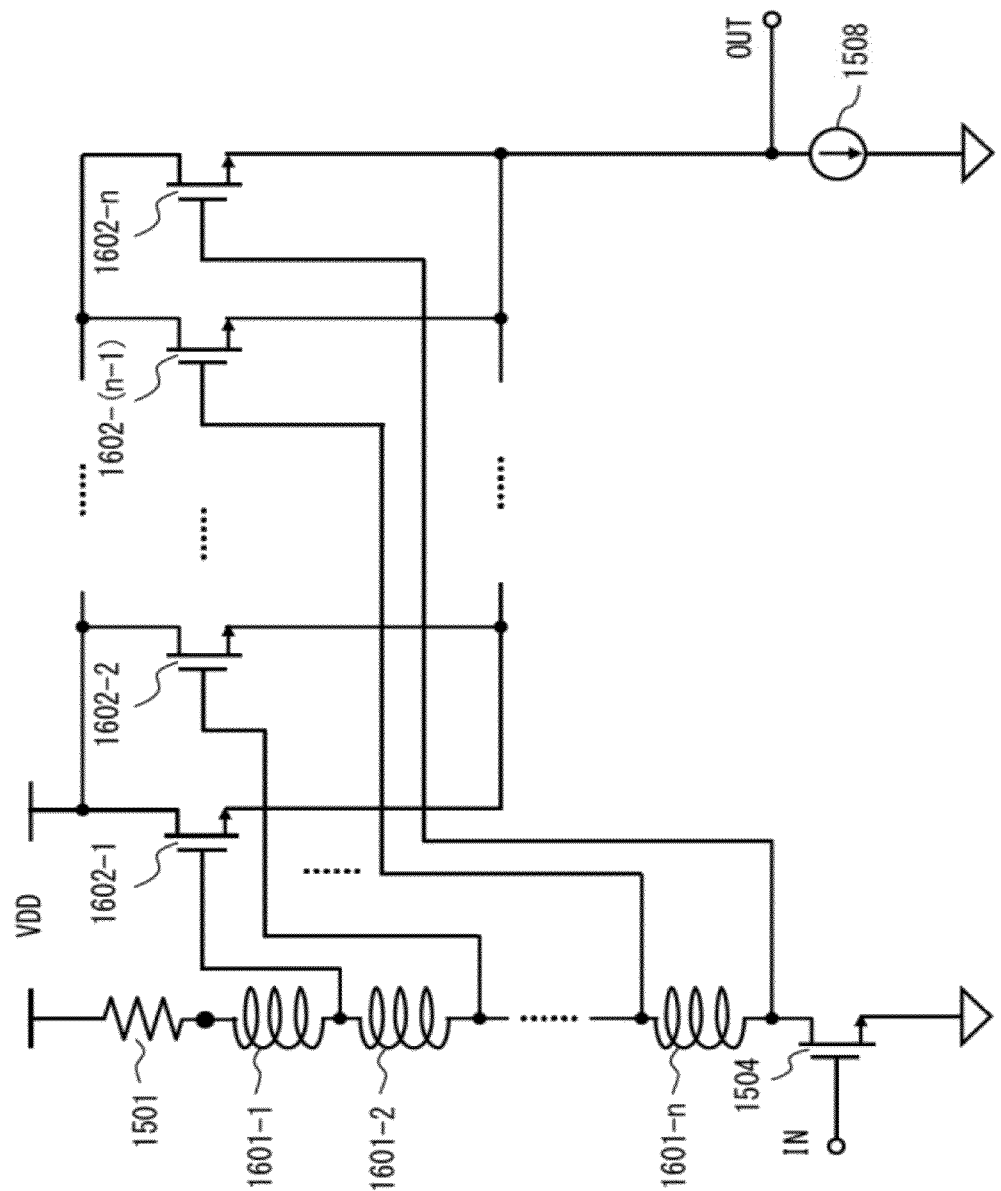
FIG. 17 illustrates a configuration of a third 2-stage amplification circuit.

In the 2-stage source grounded amplification circuit in FIG. 16, the inductors 1603-1 through 1603-(n−1) may be replaced with the wiring inductances. FIG. 17 illustrates the configuration of the 2-stage amplification circuit in this case.

Described next is an embodiment of dividing the transistor in the second stage into a plurality of transistors in the 2-stage differential amplification circuit.

Figure 18:
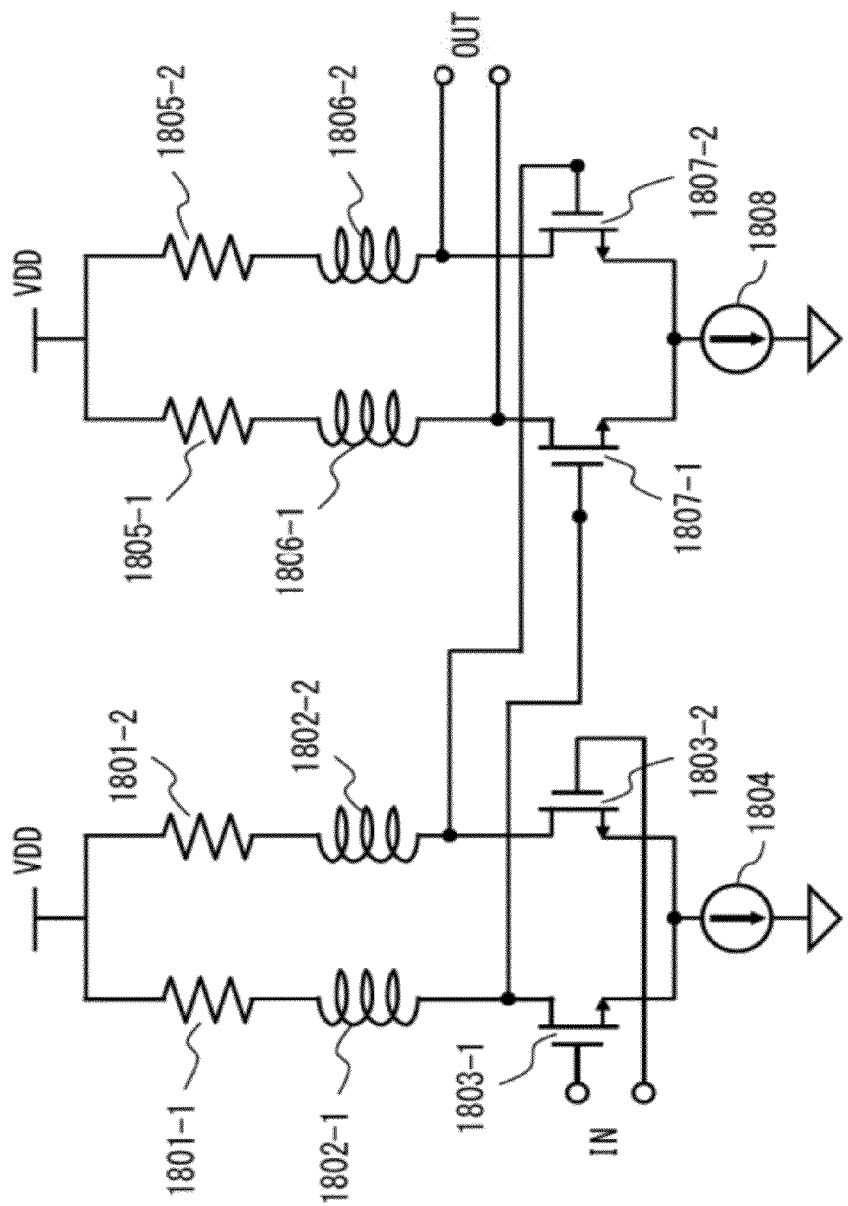
FIG. 18 illustrates a configuration of a first 2-stage differential amplification circuit.

FIG. 18 is an example of a configuration of a 2-stage differential amplification circuit when the transistor in the second stage is not divided. The 2-stage differential amplification circuit in FIG. 18 includes resistors 1801-1, 1801-2, 1805-1, 1805-2, and inductors 1802-1 and 1802-2, 1806-1 and 1806-2. The 2-stage differential amplification circuit in FIG. 18 further includes transistors 1803-1, 1803-2, 1807-1, and 1807-2, and current sources 1804 and 1805.

The transistors 1803-1 and 1803-2 are differential transistors in the first stage, and the transistors 1807-1 and 1807-2 are differential transistors in the second stage. The inductors 1802-1, 1802-2, 1805-1, and 1805-2 are load resistors, and the inductors 1802-1, 1802-2, 1806-1, and 1806-2 are shunt inductors.

The resistors 1801-1 and 1801-2, the inductors 1802-1 and 1802-2, the transistors 1803-1 and 1803-2, and the current source 1804 configure the differential amplifiers in the first stage. One terminal of the resistor 1801-j (j=1, 2) is connected to the power supply potential VDD, and the inductor 1802-j is connected in series to the other terminal. The inductor 1802-j is connected to the drain of the transistor 1803-j, and the current source 1804 is connected between the source of the transistor 1803-j and grounding potential. The current source 1804 can be replaced with a resistor.

The resistors 1805-1 and 1805-2, the inductors 8806-1 and 1806-2, the transistors 1807-1 and 1807-2, and the current source 1808 configure the differential amplifier in the second stage. One terminal of the resistor 1805-j (j=1, 2) is connected to the power supply potential VDD, and the inductor 1806-j is connected in series to the other terminal. The inductor 1806-j is connected to the drain of the transistor 1807-j, and the current source 1808 is connected between the source of the transistor 1807-j and grounding potential. The current source 1808 can be replaced with a resistor.

The drain of the transistor 1803-j in the first stage is connected to the gate of the transistor 1807-j in the second stage. The differential amplifier in the first stage amplifies the potential difference of the signal supplied to the gates of the transistors 1803-1 and 1803-2, and outputs the signal to the gates of the transistors 1807-1 and 1807-2. The differential amplifier in the second stage amplifies the potential difference of the signal supplied to the gates of the transistors 1807-1 and 1807-2, and outputs the signal from the drains of the transistors 1807-1 and 1807-2.

Figure 19:
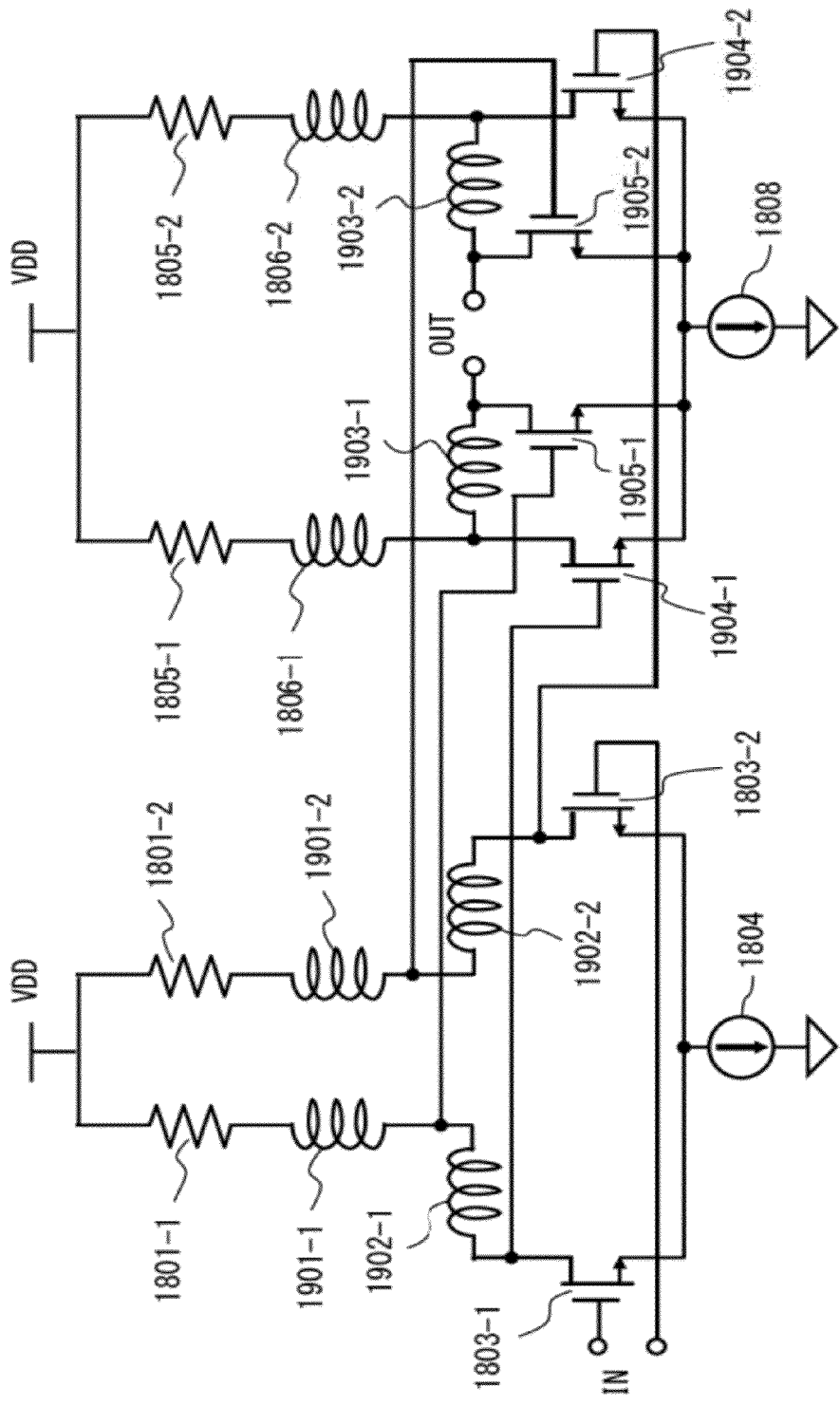
FIG. 19 illustrates a configuration of a second 2-stage differential amplification circuit.

FIG. 19 is an example of a configuration in which each of the transistors 1807-1 and 1807-2 is divided into two transistors. The 2-stage differential amplification circuit in FIG. 19 has a configuration in which the transistor 1807-j (j=1, 2) is replaced with transistors 1904-j and 1905-j in the 2-stage differential amplification circuit in FIG. 18. Furthermore, the inductor 1802-j is replaced with inductors 1901-j and 1902-j, and the inductors 1903-1 and 1903-2 are added. The transistors 1904-j and 1905-j are differential transistors in the second stage.

The inductors 1901-j and 1902-j in the first stage are shunt inductors and connected in series to the resistor 1801-j. The inductor 1902-j is connected to the drain of the transistor 1803-j.

The inductor 1806-j in the second stage is connected to the drain of the transistor 1904-j, and the drain of the transistor 1904-j and the drain of the transistor 1905-j are connected by the inductor 1903-j. The current source 1808 is connected between the sources of the transistors 1904-1, 1904-2 1905-1, and 1905-2 and the grounding potential.

The drain of the transistor 1803-j is connected to the gate of the transistor 1904-j in the second stage, and the gate of the transistor 1905-j in the second stage is connected between the inductor 1901-j and the inductor 1902-j. Therefore, the gates of the transistors 1904-j and 1905-j are connected to each other through the inductor 1902-j, and their drains are connected through the inductor 1903-j. The inductor 1903-j is provided for adjusting the signal timing in the differential amplifier in the second stage.

An output signal of the differential amplifier in the first stage is output to the gates of the transistors 1904-1, 1904-2, 1905-1, and 1905-2, and an output signal of the differential amplifier in the second stage is output from the drains of the transistors 1905-1 and 1905-2.

The ratio of the sizes of the transistors 1904-j and 1905-j are not specifically limited, and the inductances of the inductors 1901-j and 1902-j may be determined depending on the sizes of the transistors 1904-j and 1905-j.

The method of connecting the gates of the inductors 1901-j and 1902-j and the transistors 1904-j and 1905-j is not limited to the connecting method in FIG. 19, but the connecting destinations of the gates of the transistors 1904-j and 1905-j may be exchanged.

With the configuration in FIG. 19, as in the case of the 2-stage source grounded amplification circuit in FIG. 7, the signal band can be expanded toward the high frequency area, thereby improving the waveform of a high-speed signal.

Figure 20:
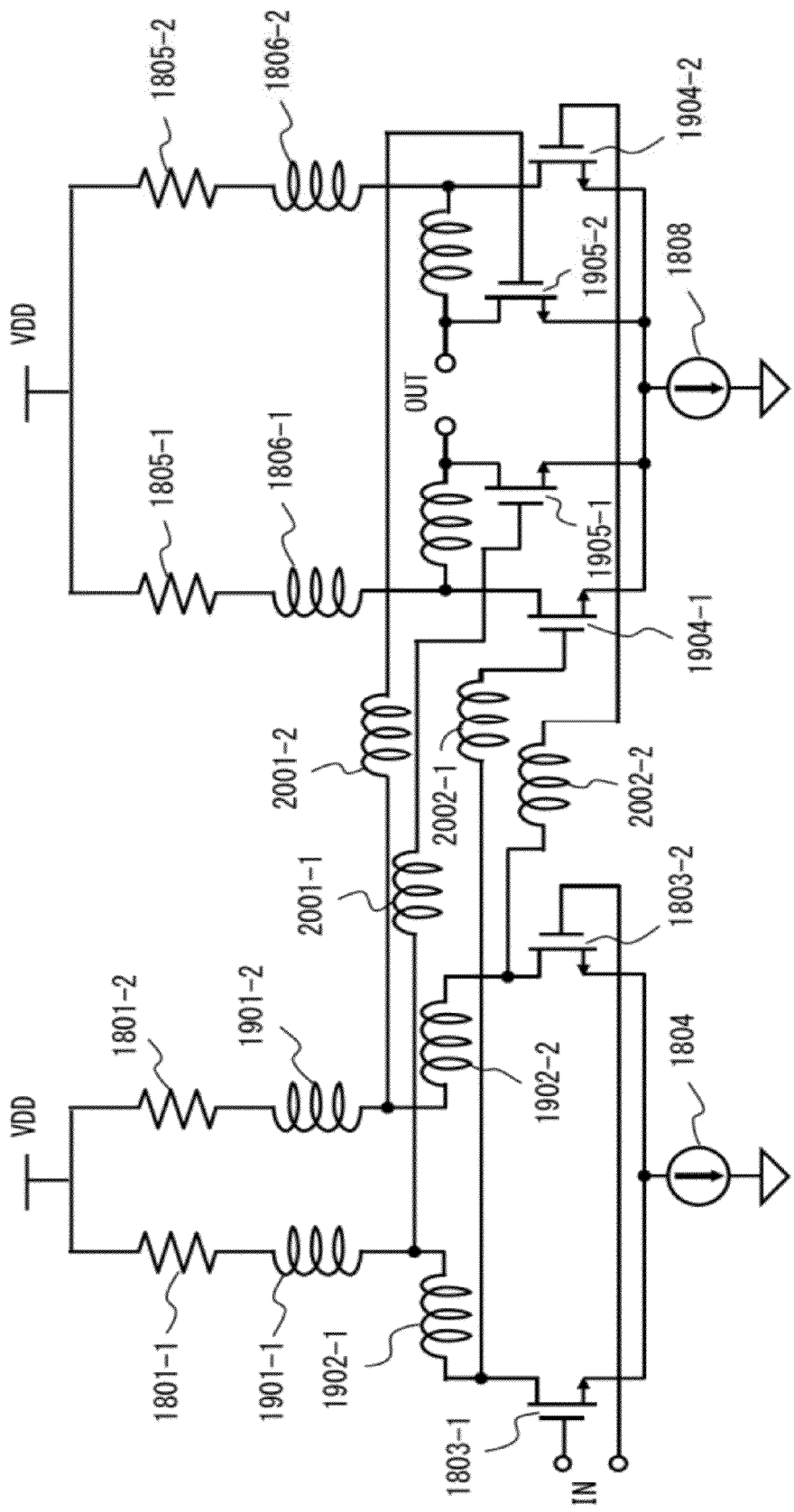
FIG. 20 illustrates a configuration of a third 2-stage differential amplification circuit.

FIG. 20 is an example of a configuration of the 2-stage differential amplification circuit in which the differential amplifier in the first stage and the differential amplifier in the second stage are connected by an inductor. The 2-stage differential amplification circuit in FIG. 20 has a configuration obtained by adding inductors 2001-1, 2001-2, 2002-1 and 2002-2.

One terminal of an inductor 2001-j (j=1, 2) is connected between the inductor 1901-j and the inductor 1902-j in the first stage, and the other terminal is connected to the gate of the transistor 1905-j in the second stage. In addition, one terminal of an inductor 2002-j is connected to the drain of the transistor 1803-j in the first stage, and the other terminal is connected to the gate of the transistor 1904-j in the second stage.

Thus, the high frequency characteristic can be further improved by connecting the differential amplifier in the first stage and the differential amplifier in the second stage by an inductor.

Also in the case of the 2-stage differential amplification circuit, as in the case of the 2-stage source grounded amplification circuit in FIG. 12 or 14, the transistor in the second stage can be divided into n (n indicates an integer of 2 or larger) transistors. Also as in the case of the 2-stage amplification circuit in FIGS. 15 through 17, a source follower transistor is employed in the differential amplifier in the second stage.

The configuration of each amplification circuit in the above-mentioned embodiment can be extended to a multi-stage amplification circuit in the third and subsequent stages. Thus, the degradation of high frequency characteristic caused by the input parasitic capacity of amplifiers in the second and subsequent stages can be reduced.

Figure 21:
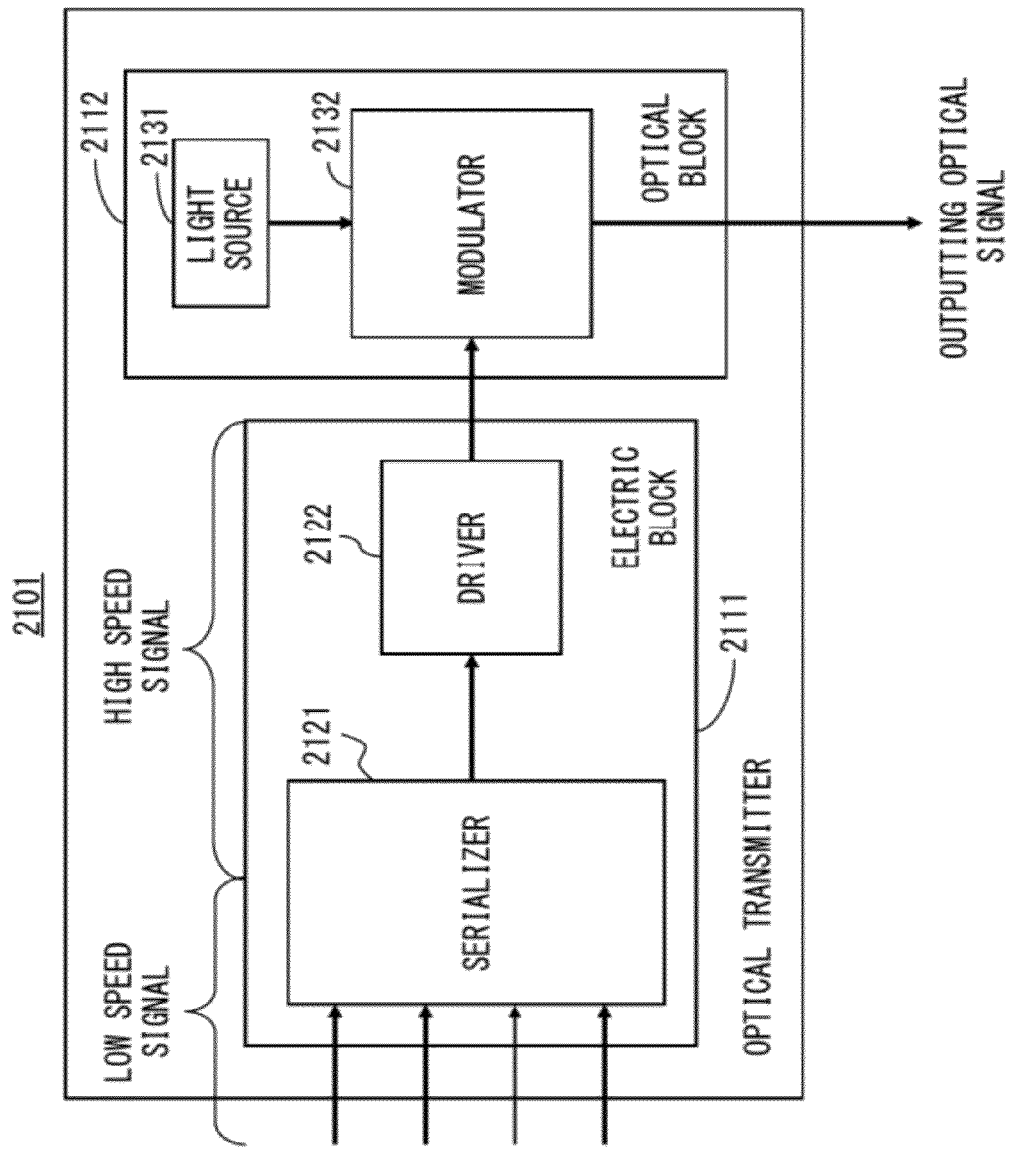
FIG. 21 illustrates a configuration of an optical transmitter.

FIG. 21 is an example of a configuration of an optical transmitter using an amplification circuit according to the embodiment. An optical transmitter 2101 in FIG. 21 includes an electric block 2111 and an optical block 2112. The electric block 2111 includes a serializer 2121 and a driver 2122, and the optical block 2112 includes a light source 2131 and a modulator 2132.

The serializer serializes a plurality of low-speed signals and generates a high-speed signal, and the driver 2122 outputs the high-speed signal as a transmission signal to the optical block 2112. For example, the serializer 2121 may generate a high-speed signal of 40 Gb/s from four low-speed signals of 10 Gb/s. The modulator 2132 modulates the signal light output from the light source 2131 by the transmission signal output from the driver 2122, and outputs the signal to the optical transmission line.

In this case, the amplification circuit according to the embodiment can be used for amplifying the high-speed signal in the serializer 2121 or the driver 2122. By using an amplification circuit having a good high frequency characteristic, a higher speed optical transmitter can be realized. The amplification circuit according to the embodiment can be applied not only to an optical transmitter but also to various devices that process a high-speed signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, should be understood that the various changes, substitutions, and alterations could be made hereto without departing from the spirit and scope of the invention.

What is claimed is:

1. An amplification circuit, comprising:
a first transistor;
a load resistor;
a plurality of inductors connected in series between the load resistor and the first transistor; and
a plurality of second transistors provided in parallel and connected to the plurality of inductors.

2. The circuit according to claim 1, wherein
each of the plurality of inductors is connected to a gate of each of the plurality of second transistors through wiring or an inductor.

3. The circuit according to claim 1, wherein
drains of adjacent second transistors of the plurality of second transistors are connected to each other through an inductor or wiring.

4. The circuit according to claim 3, wherein
the first transistor and the plurality of second transistors are source grounded transistors.

5. The circuit according to claim 1, wherein
sources of adjacent second transistors of the plurality of second transistors are connected to each other through an inductor or wiring.

6. The circuit according to claim 5, wherein
the first transistor is a source grounded transistor, and the plurality of second transistors are source follower transistors.

7. A differential amplification circuit, comprising:
first and second differential transistors;
first and second load resistors;
a plurality of first inductors connected in series between the first load resistor and the first differential transistor;
a plurality of second inductors connected in series between the second load resistor and the second differential transistor;
a plurality of third differential transistors provided in parallel and connected to the plurality of first inductors; and
a plurality of fourth differential transistors provided in parallel and connected to the plurality of second inductors.

8. The circuit according to claim 7, wherein
each of the plurality of first inductors and a gate of each of the plurality of third differential transistors are connected through wiring or an inductor, and each of the plurality of second inductors and a gate of each of the plurality of fourth differential transistors are connected through wiring or an inductor.

9. The circuit according to claim 7, wherein
drains of adjacent third differential transistors of the plurality of third differential transistors are connected to each other through an inductor or wiring, and drains of adjacent fourth differential transistors of the plurality of fourth differential transistors are connected to each other through an inductor or wiring.

10. The circuit according to claim 7, wherein
sources of adjacent third differential transistors of the plurality of third differential transistors are connected to each other through an inductor or wiring, and sources of adjacent fourth differential transistors of the plurality of fourth differential transistors are connected to each other through an inductor or wiring.

11. An optical transmitter, comprising:
a signal generation unit configured to generate a transmission signal; and
a modulation unit configured to modulate signal light by the transmission signal and generate an optical signal, wherein
the signal generation unit comprises:
   a first transistor;
   a load resistor;
   a plurality of inductor connected in series between the load resistor and the first transistor; and
   a plurality of second transistors provided in parallel and connected to the plurality of inductors.

* * * * *